US011681176B2

(12) United States Patent
Hakemi et al.

(10) Patent No.: US 11,681,176 B2
(45) Date of Patent: Jun. 20, 2023

(54) SOLAR REFLECTIVE AND ABSORPTIVE ELECTRICALLY-SWITCHABLE FILM AND GLAZING

(71) Applicant: GAUZY LTD., Tel-Aviv (IL)

(72) Inventors: Hassan-Ali Hakemi, Macherio (IT); Adrian Lofer, Kfar Saba (IL); Eyal Peso, Bat Yam (IL); Dana Gal-Fuss, Tel Aviv (IL)

(73) Assignee: GAUZY LTD., Tel-Aviv (IL)

( * ) Notice: Subject to any disclaimer, the term of this patent is extended or adjusted under 35 U.S.C. 154(b) by 0 days.

(21) Appl. No.: 15/559,065

(22) PCT Filed: Mar. 13, 2016

(86) PCT No.: PCT/IL2016/050275
§ 371 (c)(1),
(2) Date: Sep. 18, 2017

(87) PCT Pub. No.: WO2016/147175
PCT Pub. Date: Sep. 22, 2016

(65) Prior Publication Data
US 2018/0252950 A1    Sep. 6, 2018

Related U.S. Application Data

(60) Provisional application No. 62/134,612, filed on Mar. 18, 2015.

(51) Int. Cl.
*G02F 1/1334* (2006.01)
*G02F 1/137* (2006.01)
(Continued)

(52) U.S. Cl.
CPC .......... *G02F 1/1334* (2013.01); *C09K 19/544* (2013.01); *G02F 1/13725* (2013.01);
(Continued)

(58) Field of Classification Search
CPC ............. G02F 2201/083; G02F 1/1334; G02F 1/13725; G02F 1/13731; G02F 1/13718;
(Continued)

(56) References Cited

U.S. PATENT DOCUMENTS 4,749,261 A  *  6/1988  McLaughlin ..... B32B 17/10018
349/104
5,216,530 A       6/1993  Pearlman et al.
(Continued)

FOREIGN PATENT DOCUMENTS

CN          1409157 A        4/2003
CN          1181568 A        9/2003
(Continued)

OTHER PUBLICATIONS

Zhou et al. (2004). Comparison of the thermo- and electro-optical properties of doped and un-doped MOM based PDLCs. Optics Communications 231 (2004), 263-271. doi:10.1016/j.optcom.2003.12.040.
(Continued)

*Primary Examiner* — Paisley L Wilson
(74) *Attorney, Agent, or Firm* — The Roy Gross Law Firm, LLC; Roy Gross

(57) ABSTRACT

The present invention provides a solar reflective-absorptive device, comprising: an IR reflective transparent conductive film; a flexible transparent conductive film; a layer of liquid crystal dispersion in polymer matrix or polymer dispersion in liquid crystal domains allocated between said flexible IR reflective transparent conductive film and said flexible transparent conductive film. The liquid crystal dispersion is in polymer matrix or polymer dispersion domains, and comprises metalorganic dye compositions with absorption in the visible and/or IR regions of solar spectrum. The aforesaid liquid crystal dispersion consists of nematic mixtures and/or
(Continued)

cholesteric mixtures comprising of chiral mesogenic or none-mesogenic chiral materials in nematic for IR absorption and/or broadband cholesteric materials for dynamic (electrically tunable) IR and visible absorption. The switching capability of the device will be carried out through reorientation of the liquid crystal dispersion sandwiched between said at least one transparent IR-reflective flexible conductive support and said transparent flexible conductive support.

20 Claims, 11 Drawing Sheets

(51) Int. Cl.
    *C09K 19/54*     (2006.01)
    *H01L 31/0216*     (2014.01)
    *H01L 31/0232*     (2014.01)
    *E06B 9/24*     (2006.01)

(52) U.S. Cl.
    CPC .. *H01L 31/02168* (2013.01); *H01L 31/02327* (2013.01); *C09K 2219/13* (2013.01); *E06B 2009/2464* (2013.01); *G02F 1/13756* (2021.01); *G02F 2201/083* (2013.01); *G02F 2203/11* (2013.01)

(58) Field of Classification Search
    CPC ......... G02F 2203/11; E06B 2009/2464; C09K 19/544; C09K 2219/13
    See application file for complete search history.

(56) References Cited

U.S. PATENT DOCUMENTS

| | | | |
|---|---|---|---|
| 5,641,426 A | | 6/1997 | Nerad et al. |
| 5,843,333 A | * | 12/1998 | Hakemi ................. C09K 19/40 252/299.5 |
| 9,904,129 B2 | * | 2/2018 | Min ........................ B60J 7/043 |
| 10,620,431 B2 | * | 4/2020 | Yu ...................... H01Q 21/0087 |
| 2004/0233351 A1 | | 11/2004 | Lazarev |
| 2006/0066803 A1 | | 3/2006 | Aylward et al. |
| 2008/0316381 A1 | | 12/2008 | Wu |
| 2008/0317977 A1 | | 12/2008 | Wu |
| 2009/0115922 A1 | | 5/2009 | Veerasamy |
| 2010/0245221 A1 | | 9/2010 | Khan |
| 2011/0097562 A1 | | 4/2011 | Brill et al. |
| 2011/0100420 A1 | * | 5/2011 | Clevenger ........... H01L 31/0488 136/246 |
| 2014/0141192 A1 | | 5/2014 | Fernando et al. |
| 2014/0293436 A1 | | 10/2014 | Nagahama et al. |
| 2014/0320776 A1 | * | 10/2014 | Taheri ................... G02F 1/0045 349/16 |

FOREIGN PATENT DOCUMENTS

| | | |
|---|---|---|
| CN | 102804004 A | 11/2012 |
| CN | 104240958 A | 12/2014 |
| EP | 0780721 A1 | 6/1997 |
| EP | 0860718 A2 | 8/1998 |
| EP | 1225471 A2 | 7/2002 |
| EP | 2617795 A2 | 7/2013 |
| WO | 2013036386 A1 | 3/2013 |

OTHER PUBLICATIONS

Buyuktanir et al. (2006) Flexible Bistable Smectic—A Polymer Dispersed Liquid Crystal Display Japanese Journal of Applied Physics, vol. 45 (5A): 4146-4151. DOI:10.1143/JJAP.45.4146.
Extended European Search Report for European Application No. 16764333.7, dated Aug. 22, 2018, 12pp.
PCT International Search Report for International Application No. PCT/IL16/50275, dated Sep. 19, 2016, 3pp.
PCT Written Opinion for International Application No. PCT/IL16/50275, dated Sep. 19, 2016, 10pp.
PCT International Preliminary Report on Patentability for International Application No. PCT/IL16/50275, completed Jun. 20, 2017, 18pp.
Chen, Fengkun & Jie, Zhang & XinHua, Wan. (2011). Synthesis and characterization of novel near-infrared electrochromic cholesteric liquid crystalline polymers with chiroptical switching properties. Scientia Sinica Chimica. 41. 341-350. doi: 10.1360/032010-755, Abstract only.

* cited by examiner

SOLAR REFLECTIVE AND ABSORPTIVE ELECTRICALLY-SWITCHABLE FILM AND GLAZING

CROSS-REFERENCE TO RELATED APPLICATIONS

This application is a U.S. National Phase filing under 35 U.S.C. 371 of International (PCT) Patent Application No. PCT/IL2016/050275, filed 13 Mar. 2016, which claims priority from U.S. Patent Application No. 62/134,612, filed 18 Mar. 2015, both of which are incorporated by reference in their entirety.

FIELD OF THE INVENTION

The present invention relates to electrically-switchable liquid crystal device, more specifically to glass decoration and energy conservation glazing for automotive, building, marine and aviation glazing applications, and more particularly, relates to a solar reflective film or coating with light control function as part of glass in the abovementioned applications. Such solar control device allows adjustment of both IR and visible light transmittance in a range from opaque to clear, as desired, while controlling and shielding the amount of solar radiation (heat).

BACKGROUND OF THE INVENTION

Now, with the growing consciousness of energy conservation and environment protection and with continuous improvement of people's living standards, application of solar control films becomes more and more popular. The films are commonly adhered to the inner surface of window glasses in automobiles and buildings to shield solar radiant heat from entering, to provide a comfortable and suitable environment for the people inside, and at the same time, to provide a corresponding degree of privacy to the people residing inside, according to products with different visible light transmittance.

Solar control film is a functionally treated thin film, having a function of blocking solar radiant heat.

Polymer dispersed liquid crystal (PDLC) film is a photo-electrically responsive material with liquid crystal droplets uniformly dispersed in a polymer matrix. Transparency of the PDLC film may be changed from opaque to clear under an external electric field.

US Patent No. 20080316381 discloses a light control film, which comprises a stain-resistant layer, two polymer film layers, a liquid crystal light control layer, and an adhesive. The light control film has light control and stain-resistant functions.

US Patent No. 20080317977 discloses a light control film, which comprises a stain-resistant layer, an abrasion resistant layer, an anti-glare layer, two polymer film layers, a liquid crystal light control layer, and an adhesive. The light control film has functions of light control, abrasion resistance, anti-reflection, and stain-resistance.

U.S. Pat. No. 5,641,426 discloses an optically responsive film, which comprises liquid crystal droplets dispersed in a cross-linked polymer, wherein the polymer comprises at least one type of vinyl ether.

PCT publication WO2013/036386 discloses a sun control window film with light control function, comprising: an anti-dirty layer; a curing layer arranged under the anti-dirty layer; a sun control function layer arranged under the curing layer; two ITO PET layers; a polymer dispersed liquid crystal layer; and a lower surface polyester protective release layer, wherein a bottom surface of one of the ITO PET layers is attached to the lower surface polyester protective release layer by contact adhesive.

A major problem with conventional solar control films is that visible light transmittance of single-layer solar control film products is fixed and unchangeable, and cannot be adjusted according to people's desire for brightness and darkness as well as for heat shielding. Therefore, there is still a long felt unmet need to provide improved switchable light reflective film.

SUMMARY OF THE INVENTION

A solar absorbing-reflective film, comprising: at least one flexible IR reflective transparent conductive film; at least one flexible transparent conductive film; at least one first layer of liquid crystal dispersions allocated between said flexible IR reflective transparent conductive film or said flexible transparent conductive film and at least one second layer of liquid crystal dispersions; at least one electrical contact in communication with said flexible transparent conductive film; wherein said liquid crystal dispersion comprises metal-organic mesogen dyes compositions.

The solar absorbing-reflective film where the flexible IR reflective transparent conductive film is composed of thin metallic layers or metal oxide layers.

The solar absorbing-reflective film, where the thin metallic layers or metal oxide layers are made of materials selected from a group consisting of silver, gold, titanium dioxide, bronze, or stainless steel and any combination thereof.

The solar absorbing-reflective, where at least one layer of liquid crystal dispersion is made of nematic liquid crystal mixtures in said liquid crystal dispersion.

The solar absorbing-reflective film, where at least one layer of liquid crystal dispersion comprises cholesteric liquid crystal mixtures, characterized by comprising a broadband wavelength reflecting capabilities, in said liquid crystal dispersion adapted to reflect energy in said dynamic solar-reflection mode.

The solar absorbing-reflective film, where at least one layer of liquid crystal dispersion is made of nematic mixtures of liquid crystal in said liquid crystal dispersion further comprising chiral nematic mixtures, adapted to behave as a broadband cholesteric phase.

The solar absorbing-reflective film, where the solar absorbing-reflective film is integrated within a liquid crystal device.

The solar absorbing-reflective film, where the liquid crystal composition can be PDLC, PNLC, PSCT or other.

The solar absorbing-reflective film, where the device is a flexible electrooptical liquid crystal device.

The solar absorbing-reflective film, where the liquid crystal is characterized by a liquid crystal dispersion morphology in polymer matrix of nano-droplets, micro-droplets, macro-droplets or network gel.

The solar absorbing-reflective film, where the liquid crystal dispersion could be made by phase separation or micro-encapsulation methods.

The solar absorbing-reflective film, where the liquid crystal is characterized by the possibility of containing dichroic organic and metal-organic compositions.

The solar absorbing-reflective film, where at least one of the flexible reflective transparent conductive film is made of transparent coating, such as Indium Tin Oxide (ITO).

The solar absorbing-reflective film, where at least one of the flexible reflective transparent conductive film is made of conductive polymer coating, such as PEDOT-SS.

The solar absorbing-reflective film, where a reflectivity enhancer coating can be applied to a transparent conductive film selected from a group consisting of said flexible transparent conductive film, said flexible IR reflective transparent conductive film and any combination thereof.

The solar absorbing-reflective film, where the solar reflective film can be composed of any combination of said transparent conducting film.

The solar absorbing-reflective film, where the broad-band cholesteric materials comprise cholesteric pitch in IR region.

The solar absorbing-reflective film, where the heat reflection of switchable film is dynamically controlled by the amount of electric field.

The solar absorbing-reflective film, wherein the transparency of switchable film is dynamically controlled by the amount of electric field.

The solar absorbing-reflective film, where the cholesteric mixtures can be composed by at least two different layers of cholesteric materials having opposite chirality orientations.

The solar absorbing-reflective film, where the cholesteric mixtures can be a mix of opposite chirality orientation cholesteric materials encapsulated by micro-encapsulation technique.

The solar absorbing-reflective film, where the solar reflective switchable film comprises a pattern.

The solar absorbing-reflective film, where the solar reflective switchable film comprises a low-definition display or signage.

The solar absorbing-reflective film, where the solar-control switchable film comprises bi-stable capabilities of the liquid crystal composition.

A method for manufacturing a solar absorbing-reflective film, comprising steps of: providing at least one flexible IR reflective transparent conductive film; providing at least one flexible transparent conductive film; providing at least one layer of liquid crystal dispersions; providing at least one electrical contact in communication with said flexible transparent conductive film; positioning said at least one layer of liquid crystal dispersions between said flexible IR reflective transparent conductive film and said flexible transparent conductive film; connecting said electrical contact to said flexible transparent conductive film; thereby providing said solar absorbing-reflective film; wherein said step (c) further comprising a step of introducing metal-organic mesogens dyes compositions in said at least one layer of liquid crystal dispersions, The method, where the flexible IR reflective transparent conductive film is composed of thin metallic layers or metal oxide layers.

The method, where the thin metallic layers or metal oxide layers are made of materials selected from a group consisting of silver, gold, titanium dioxide, bronze, or stainless steel and any combination thereof.

The method, where at least one layer of liquid crystal dispersion is made of nematic mixtures of liquid crystal in said liquid crystal dispersion adapted to reflect energy in said static solar-reflection mode;

The method, where at least one layer of liquid crystal dispersion comprises cholesteric mixtures of liquid crystal, characterized by comprising a broad-band wavelength reflecting capabilities, in said liquid crystal dispersion adapted to reflect energy in said dynamic solar-reflection mode.

The method, where at least one layer of liquid crystal dispersion is made of nematic mixtures of liquid crystal in said liquid crystal dispersion further comprising chiral nematic mixtures, adapted to behave as a broadband cholesteric mixture.

The method, where said solar absorbing-reflective film is integrated within a liquid crystal device.

The method, where the liquid crystal composition can be PDLC, PNLC, PSCT or other.

The method, where said device is a flexible electro-optical liquid crystal device.

The method, where said liquid crystal is characterized by a liquid crystal dispersion morphology in polymer matrix of nano-droplets, micro-droplets, macro-droplets or network gel.

The method, where said liquid crystal dispersion could be made by phase separation or micro-encapsulation methods.

The method, where the liquid crystal is characterized by the possibility of containing dichroic organic and metal-organic compositions.

The method, where at least one of the flexible reflective transparent conductive film is made of transparent coating, such as Indium Tin Oxide (ITO).

The method, where at least one of the flexible reflective transparent conductive film is made of conductive polymer coating, such as PEDOT-SS.

The method, where the flexible IR reflective transparent conductive film can be coated with an enhanced reflective film.

The method, where the flexible transparent conductive film can be coated with an enhanced reflective film.

The method, where the solar reflective film can be composed of any combination of said transparent conducting film.

The method, where the broad-band cholesteric materials comprise cholesteric pitch in visible or IR region.

The method, where the heat reflection of said switchable film is dynamically controlled by the amount of electric field.

The method, where the transparency of said switchable film is dynamically controlled by the amount of electric field.

The method, where the cholesteric mixtures can be composed by at least two different layers of cholesteric materials having opposite chirality orientations.

The method, where the cholesteric mixtures can be a mix of opposite chirality orientation cholesteric materials encapsulated by micro-encapsulation technique.

The method, where the solar reflective switchable film comprises a pattern.

The method, where the solar reflective switchable film comprises a low-definition display or signage.

The method, where the solar-control switchable film is bi-stable.

DETAILED DESCRIPTION OF THE INVENTION

Figure 1:
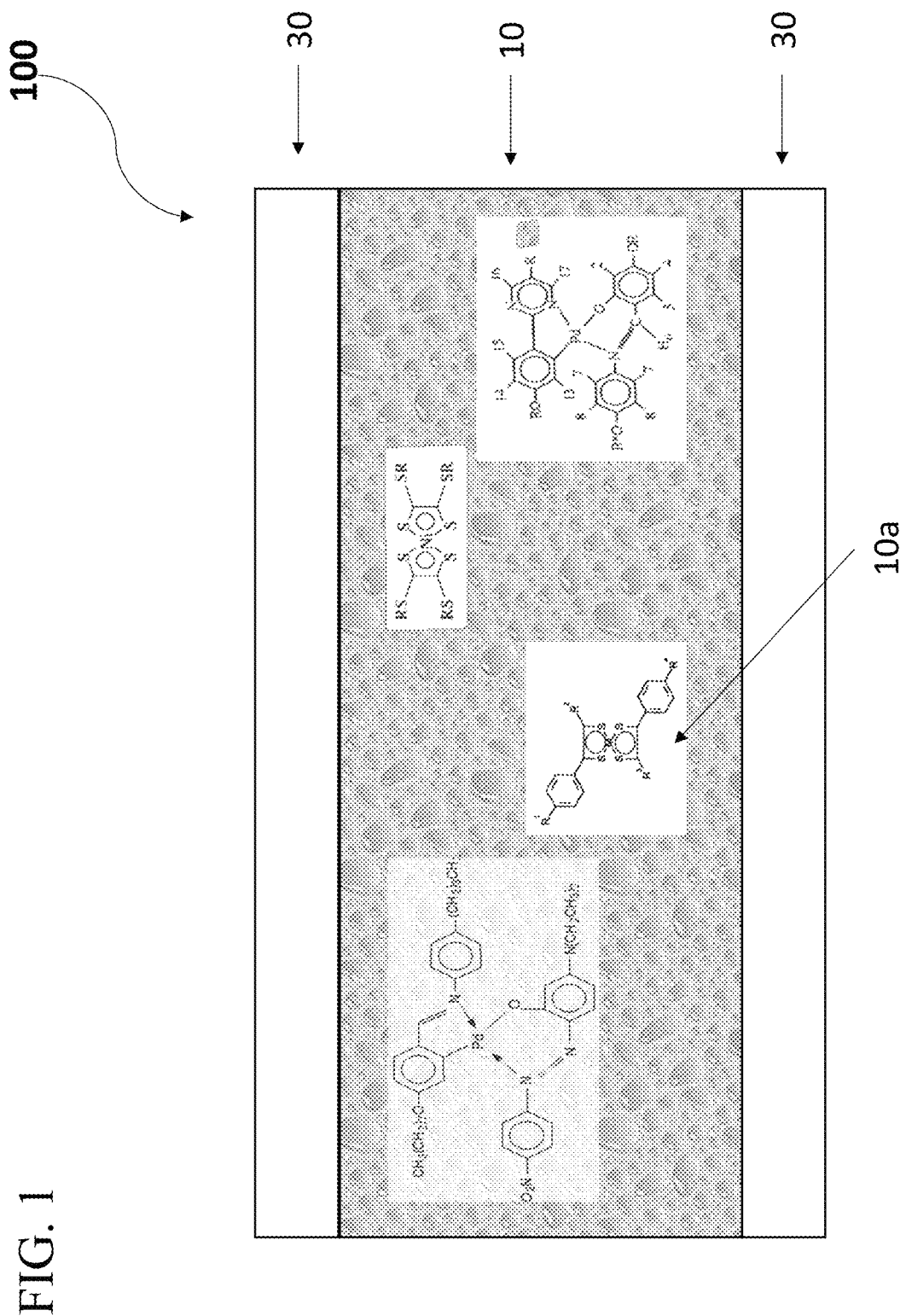
FIG. 1—schematic representation of one embodiment of the solar reflective film.

The following description is provided, so as to enable any person skilled in the art to make use of said invention and sets forth the best modes contemplated by the inventor of carrying out this invention. Various modifications, however, are adapted to remain apparent to those skilled in the art, since the generic principles of the present invention have been defined specifically to provide an electrically-switchable solar reflective film. Thus a novel film has been obtained. The solar reflective-absorptive components are added to PDLC, PNLC, PSLC, PSCT film composition, thereby providing a film and/or window device with the following properties: switchable and tunable IR and visible reflection, transmission and absorption of solar spectrum.

Retrofit(ting): refers hereinafter to the modification of a conventional window or surface by combining the same in some manner with an enhancement, i.e., a switchable glazing, non-switchable light modulating device, etc.

The present invention is based partially on prior Gauzy's claimed technology in Provisional Patent Application 62/065,805.

According to the present invention, optical properties of the film are modifiable by means of introducing solar-reflective components into the composition of PDLC, PNLC, PSLC, PSCT Film and glass device.

The term "reflective" refers hereinafter to the reflection of the portion of the electromagnetic spectrum that is visible to (can be detected by) the human eye. Electromagnetic radiation in this range of wavelengths is called visible light or simply light. A typical human eye will respond to wavelengths from about 400 to about 700 nm. As well, to the reflection of the portion of the electromagnetic spectrum that is invisible to (cannot be detected by) the human eye, that are included between the wavelengths from about 700 to about 1600 nm, and includes the infra-red (IR) or heat region of electromagnetic radiation. In summary, the term refers hereinafter to the reflection of wavelengths from about 400 to about 1600 nm.

The term "absorptive" refers hereinafter to the absorption of the portion of the electromagnetic spectrum that is visible to (can be detected by) the human eye. Electromagnetic radiation in this range of wavelengths is called visible light or simply light. A typical human eye will respond to wavelengths from about 400 to about 700 nm. As well, to the absorption of the portion of the electromagnetic spectrum that is invisible to (cannot be detected by) the human eye, that are included between the wavelengths from about 700 to about 1600 nm, and includes the infra-red (IR) or heat region of electromagnetic radiation. In summary, the terms refers hereinafter to the absorption of wavelengths from about 400 to about 1600 nm.

The term "dye" refers hereinafter to molecules capable to absorb wavelengths from about 400 to about 1600 nm, depending on their chemical structure.

The term "high absorptive" refers hereinafter to the capability to absorb wavelengths from about 700 to about 1600 nm.

The term "low absorptive" refers hereinafter to the capability to absorb wavelengths from about 400 to about 700 nm.

The term "dichroic MOM dyes" refers hereinafter to dyes as aforementioned defined with the capabilities of changing their orientation accordingly with the presence/absence of voltage.

The term "dichroic dyes", which are generally organic but not liquid crystal, refers hereinafter to dyes as aforementioned defined with the capabilities changing their orientation accordingly with the presence/absence of voltage, but following the direction of the rotation of the ambient in which they are present.

The term "high anchoring" refers hereinafter to a high orientational alignment interaction between the liquid crystal molecules and the surface of the resin or the film substrate.

The term "low anchoring" refers hereinafter to a low orientational alignment interaction between the liquid crystal molecules and the surface of the resin or the film substrate.

The term "on-state" refers hereinafter to the state when the voltage is applied to the film.

The term "off-state" refers hereinafter to the state when no voltage is applied to the film.

The term "inverse PDLC" refers hereinafter to the state where previously "on-state" and "off-state" are inverted in their voltage characteristics.

Metal-Organic Mesogen Dyes

The structure of the organometallic liquid crystal compound comprise a metal bonded multi-aromatic unit of at least two aromatic groups covalently joined, either directly or through other polyvalent organic or inorganic connecting groups. Generally, there are at least two multi-aromatic units bonded to the metal. Illustrative of such a structure is the following:

$$R^1\text{-}R^2\text{-}R^3 \quad (1)$$

where R' and $R^3$ are the same or different moieties, each of which provides at least one covalently joined aromatic group (aromatic groups include the unsaturated heterocyclic structures), and $R^2$ contains a polyvalent metal, bonded to R' and $R^3$ by covalent, ionic or weaker bonding forces. $R^2$ may contain a ring atom of a saturated structure or an unsaturated heterocyclic structure and thus constitutes part of the aromaticity of the composition.

The metals included are vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, rare earth metals, or uranium, and the like. The compound (1) may be an anionic or cationic component of a salt in which the counter-ion is a structure that does not adversely affect the liquid crystal properties of compound (1) or combines with compound (1) to provide the liquid crystal properties.

Particularly preferred organometallic liquid crystal compositions useable in the practice of this invention comprise those of the formula:

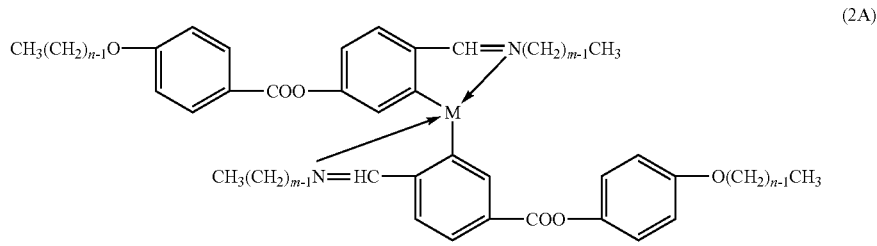

(2A)

in which M is copper, nickel, vanadyloxide and palladium and n and m are positive numbers such that compound (2) is a liquid crystal, and preferably nematogenic. In general, n and m each have a value of 2 to about 15, sufficient that the compound is mesogenic, preferably such that the compound possesses enantiotropic, monotropic, smectic, nematic and/or cholesteric phases. These compositions are described by Caruso, et al., Liquid Crystals, 1990, vol. 7, no. 3, pp. 421-430 and Liquid Crystals, 1991, vol. 10, no. 1, pp. 85-93.

Similar mesogens have the following formulae:

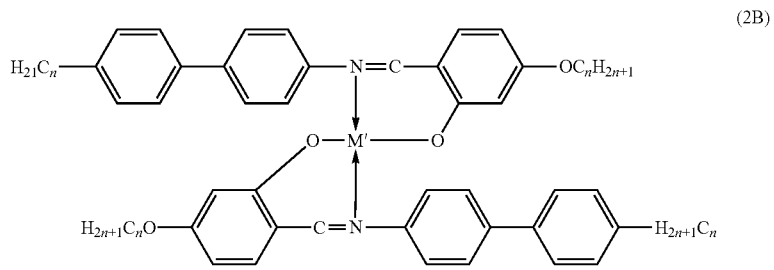

(2B)

where n is defined above, and M' is oxyvanadium and platinum. See Sadashiva, et al., Abstract, International LCC, Pisa, Italy, 1992, A-P16, p. 38.

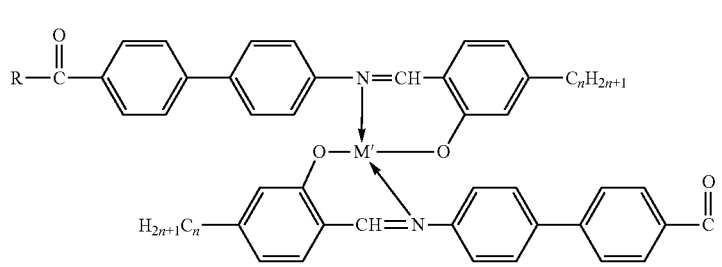

(2C)

where R is organo such a aryl, alkyl, alkoxyaryl and the like, and n is defined above. M is defined above, and is preferably copper.

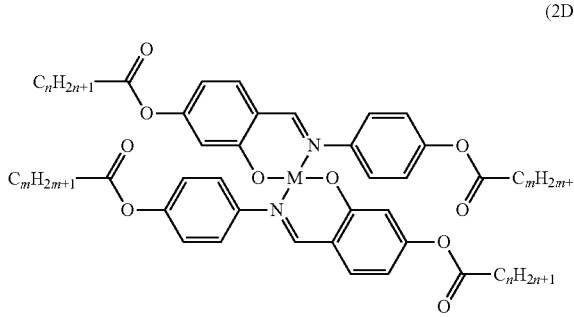

(2D)

Giroud-Godquin and Maitlis, (CA, 91:177447F) and French Patent 2,393,839, describes compounds of the formula of MOM with high absorptive IR properties:

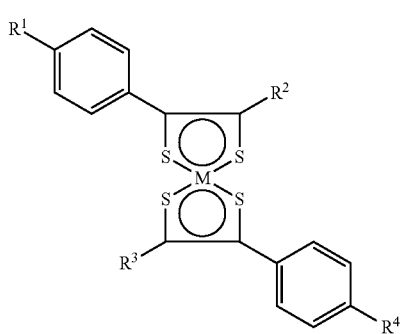

(2E)

where $R^{1,4}$ are the same or different alkyl ($C_{1-14}$), alkoxy ($C_{1-14}$) or aryl groups, $R^{2,3}$ are hydrogen or the same or different alkyl ($C_{1-4}$) groups and M is described above where R is alkyl, alkoxy or aryl, R' is H or alkyl, M is described above, preferably platinum, cobalt or vanadium. In that same family of compounds is the mesomorphic transition metal complexes of the formulae:

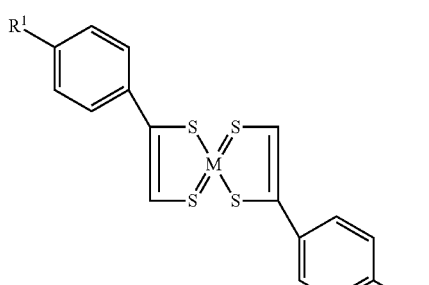

(2F)

(2G)

where $R^{1,4}$ and M are defined above. See Bruce, et al., J. Mater. Chem., 1991, 1(5), 857-861. Also included are the benzenedithiol metal complex of the formula:

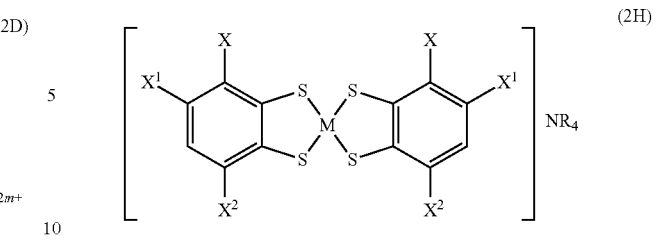

(2H)

where M is Ni, Pd or Pt, X is Cl or Br, X— and $X^2$ are H or Cl when X is Cl and H' or Br when X is Br, and R is $C_{1-14}$ alkyl. See Saito, et al., CA, 105: 2168 Hz and U.S. Pat. No. 4,508,655.

The synthesis of nickel dithiolene dyes and their precursor ligands can be conducted using methods reported by K. L. Marshal et. al. (Transition Metal Dithiolene Near-IR Dyes and Their Applications in Liquid Crystal Devices, Mol. Cryst. Liq. Cryst., Vol. 454, pp. 47/[449]-79/[481], 2006, inserted herein as reference). Three basic methods can be employed, depending on the degree of substitution desired in the complex and its overall symmetry. Mesogenic nickel dithiolenes can be synthesized by a modification of an earlier three-step procedure reported by Mueller Westerhoff et al., as shown in FIG. 10F. Although relatively simple, this method has some disadvantages in that the products are difficult to separate from the tarry byproducts formed from phosphorous pentasulfide, and, as a result, the yield of purified product is very low (5% to 15%). A second method that can be useful for preparation of alkylthio substituted nickel dithiolenes is based on literature methods reported by Wainwright and Underhill, N. Svenstrup et al., and A. Charlton et al., as shown in FIG. 10G. The method is applicable to both chiral and nonchiral terminal groups. For nonchiral terminal groups, yields of the complexes ranged from 27% to 68%, while yields of complexes with bulkier, enantiomerically enriched terminal groups were substantially lower (5%-10%). A third method allows the insertion of a flexible alkyl spacer ranging from 2 to 9 carbons between the thio group attached to the dithiolene core and an enantiomerically enriched chiral terminal group based on nonracemic carboxylic acids or alcohols, as shown in FIG. 10H. The large, flexible, and bulky terminal groups makes them somewhat difficult to isolate and purify. Currently, the overall yields for these materials are quite low, ranging from a few percent up to around 15% for materials with shorter alkyl spacer groups.

Enantiomerically Enriched Nickel Dithiolene Complexes

The most remarkable feature of this series of chiral materials is how rapidly and dramatically their melting points decrease as the length and breadth of the terminal groups increase. With the exception of the S-(+)-2-methyl-butylthioether derivative, all of the other materials are liquids at room temperature.

Figure 7:
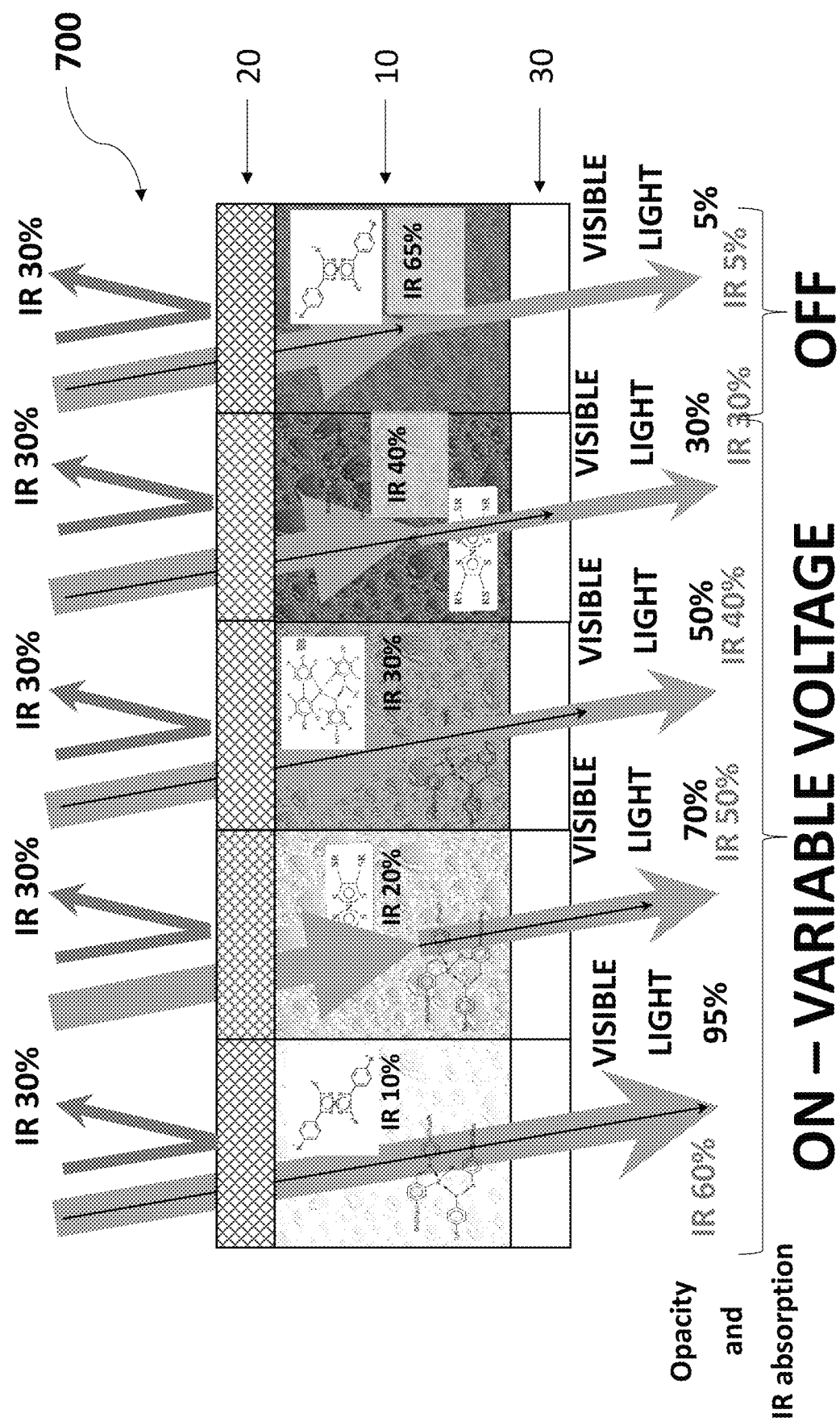
FIG. 7—schematic representation of another possible configuration of the preferred embodiment of the tunable liquid crystal film comprising one metalized solar reflective coating.

Another interesting attribute of these new chiral metal dithiolenes is that they are capable of inducing a chiral nematic phase when added to a nematic LC host. FIG. 7 shows photomicrographs under crossed polarizers of a sample of Merck E7 before and after doping with 0.5% of the S-(+)-2 methylbutythioether-substituted nickel dithiolene.

(3A)

 

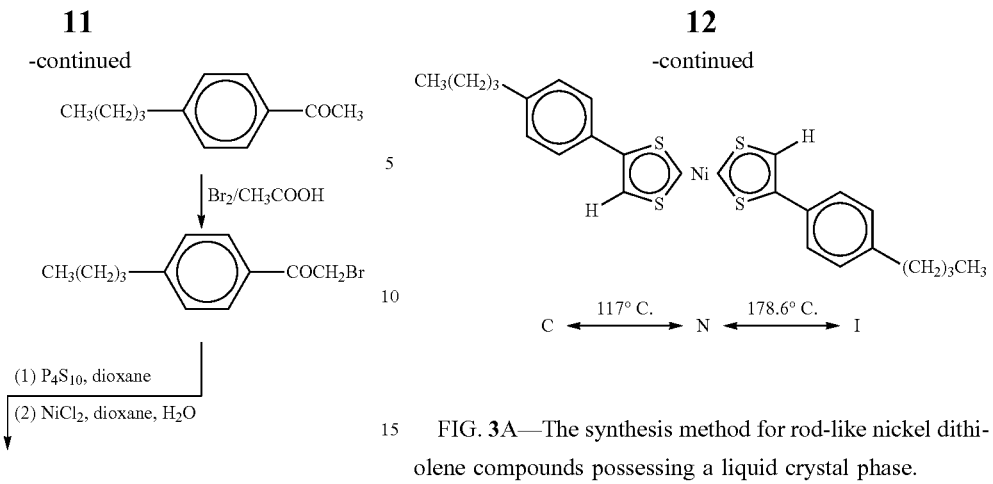
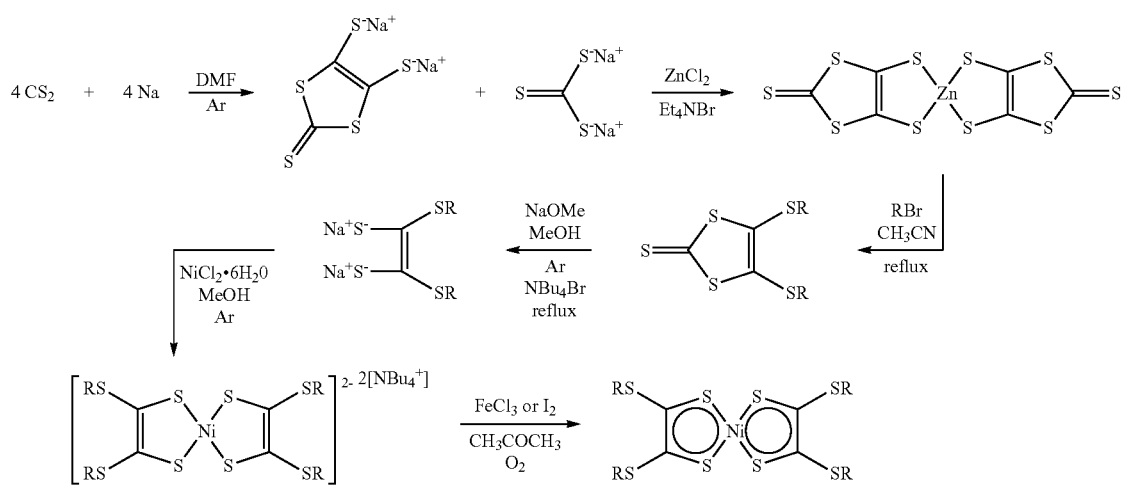
FIG. 3A—The synthesis method for rod-like nickel dithiolene compounds possessing a liquid crystal phase.
FIG. 3B—Modified synthesis scheme for preparation of tetrakis (alkylthio) bis(ethylene-1,2-dithiolene) nickel (0) complexes. Modifications to the established literature procedures resulted in substantially improved yields of product.
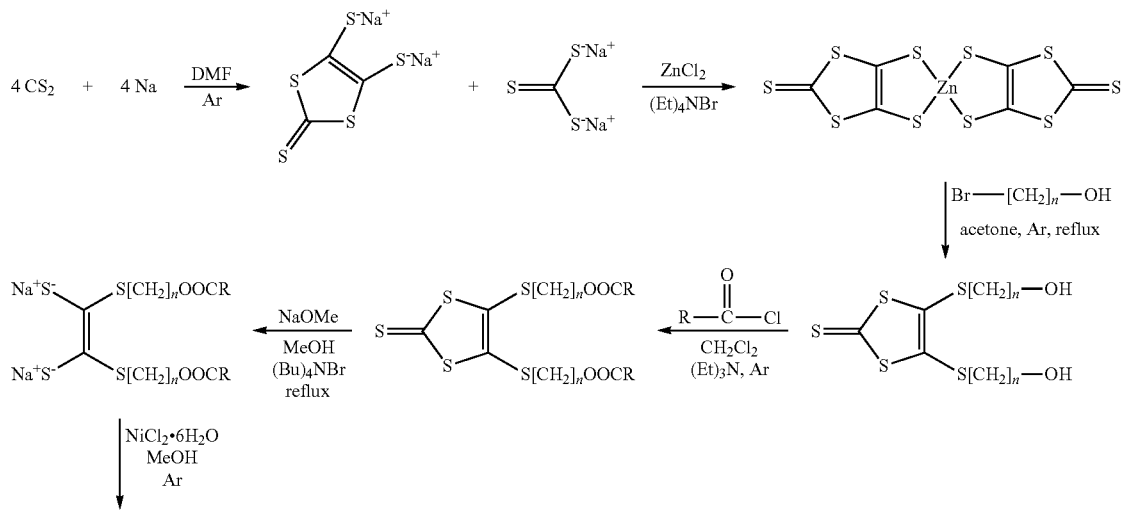

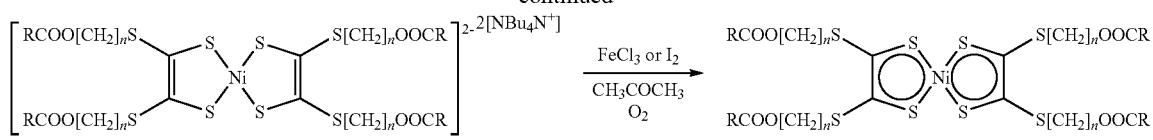

FIG. 3C—Synthesis scheme for chiral transition metal dithiolenes incorporating a flexible spacer between the terminal groups and the dithiolene core.

Also, as previously described, the following formulas of desirable organometallic mesogens are for use in the practice of the invention:

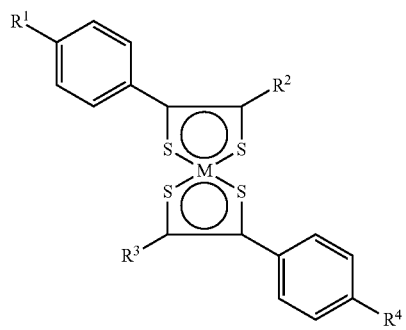

(3D)

where $R^{1,4}$ are the same or different alkyl ($C_{1-14}$), alkoxy ($C_{1-14}$) or aryl groups, $R^{2,3}$ are hydrogen or the same or different alkyl ($C_{1-4}$) groups and M is described above where R is alkyl, alkoxy or aryl, R' is H or alkyl, M is described above, preferably platinum, cobalt or vanadium. In that same family of compounds is the mesomorphic transition metal complexes of the formulae

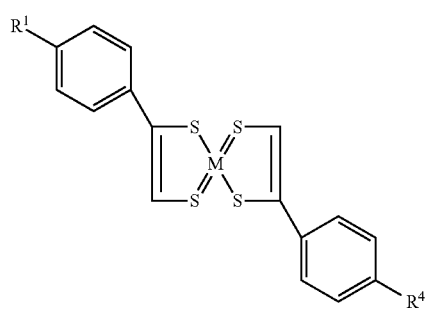

(3E)

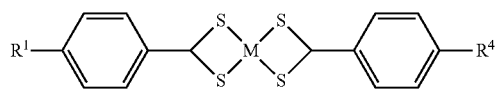

(3F)

where $R^{1,4}$ and M are defined above. See Bruce, et al., J. Mater. Chem., 1991, 1(5), 857-861.

Also included are the benzenedithiol metal complex of the formula:

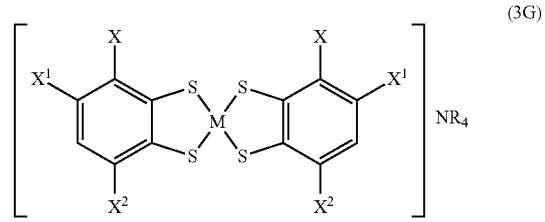

(3G)

where M is Ni, Pd or Pt, X is Cl or Br, X— and $X^2$ are H or Cl when X is Cl and H' or Br when X is Br, and R is $C_{1-14}$ alkyl. See Saito, et al., CA, 105: 2168 Hz and U.S. Pat. No. 4,508,655.

Another class of desirable organometallic mesogens for use in the practice of the invention, has the formula:

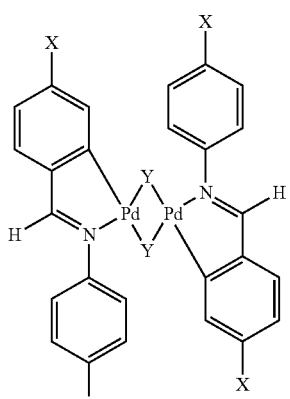

(4A)

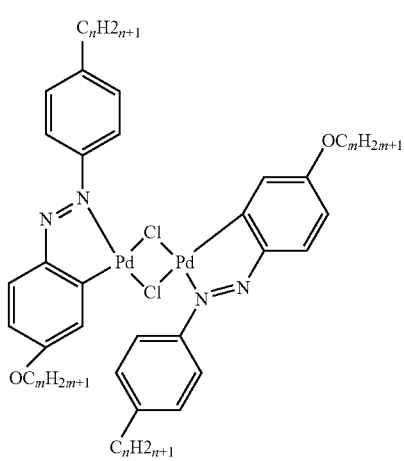

(4B)

where Y is halogen, preferably chlorine, X is hydrogen, alkyl ($C_{1-14}$), alkoxy ($C_{1-14}$), halogen (preferably chlorine, bromine or iodine), cyano, nitro, and the like, and X' is alkyl ($C_{1-14}$) or alkoxy ($C_{1-14}$). These compounds are generally described in Ros, et al., Liquid Crystal, 1991, vol. 9, no. 1, 77-86, and Ghedini, et al., MATERIALS, 1992, 4, pp. 1119-1123. Furthermore, these compounds have low absorptive IR properties.

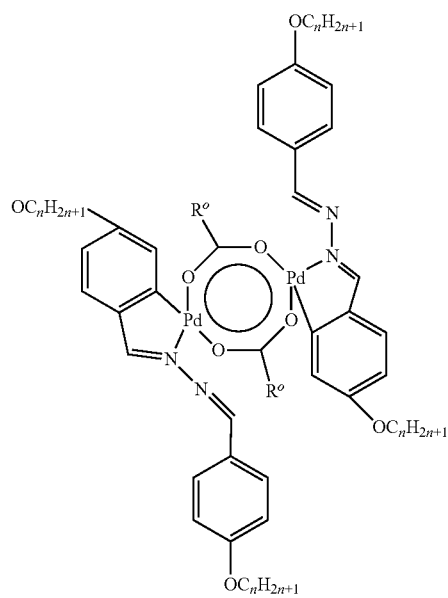

(4C)

where $R^o$ is

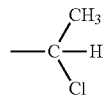

or $OC_mH_{2m+1}$, where m is 1 through 20.

The use of "cholesteric" MOM's can provide the possibility of color matching in the mixtures of MOM's or with liquid crystals, where the "absorption" colors due to the metal-complex can be combined and/or matched with that of the "reflection" colors due to cholesteric pitch for a vast range of application in liquid crystal display technology. Descriptions of such cholesteric/chiral nematic MOM's may be found in M. Ghedini et al., Liq. Cryst., Vol. 15, 33 1 (1993); and M. Ghedini et al., Chem. Mater. 5, 883 (1993).

Such cholesteric/chiral nematic compounds, which have low absorptive IR properties, may be compounds of the following formulae:

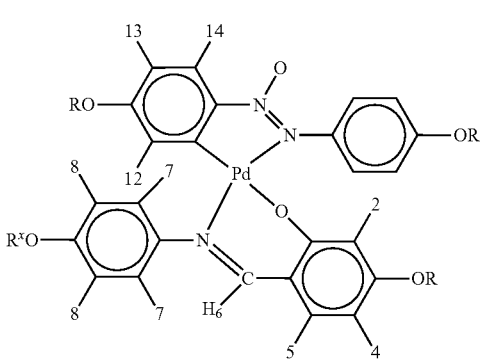

(4E)

or

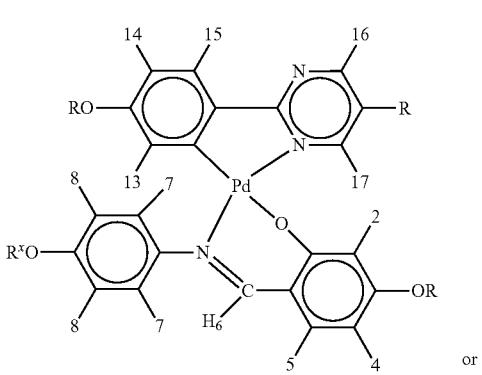

(4F)

or

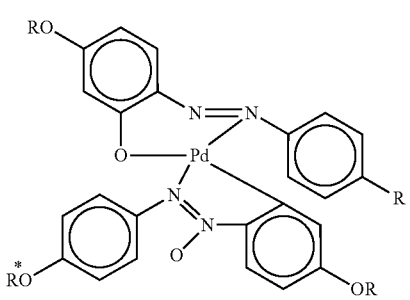

(4G)

where R is $CH_3(CH_2)_m$—, where m=1-20, and where R* is

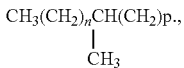

where n and p=1-10.

A description of the synthesis of the palladium complexes of the general formula 4G may be found in Italian patent application VE92A000003.

Other metal-organic liquid crystal compounds suitable for use in the present invention, which have low absorptive IR properties, include compounds of the formulae:

(5)

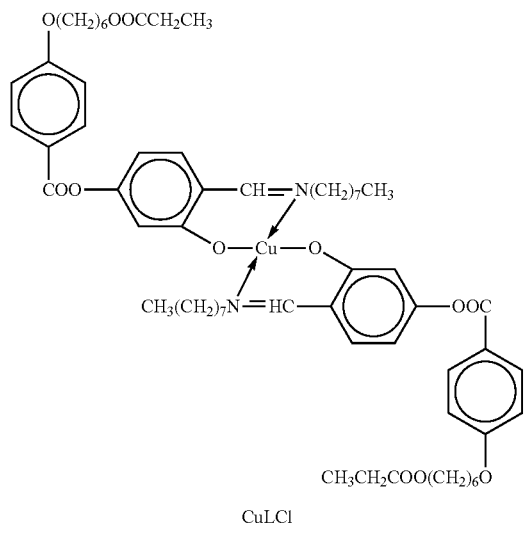

CuLCl (6)

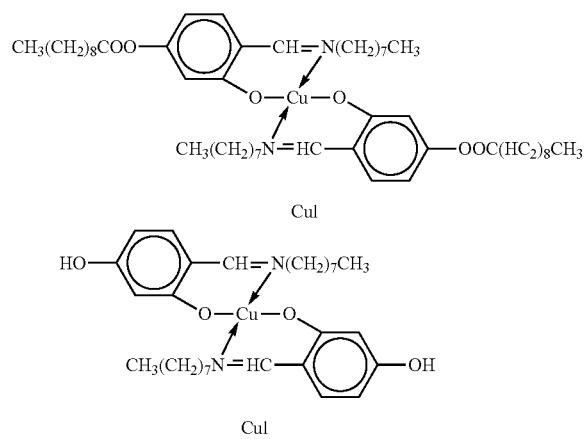

CuI

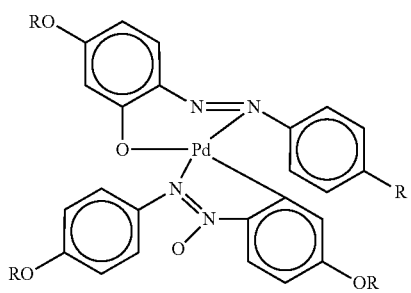

CuI

Another metal-organic mesogen suitable for use as dyes (visible absorptive) liquid crystal and polymer composites of the present invention includes compounds having the formula:

(7)

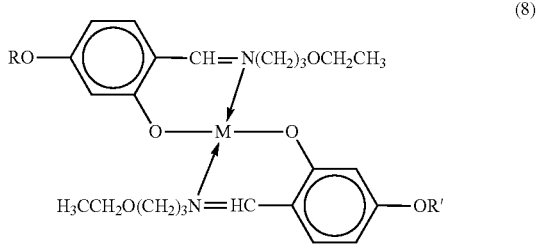

where R is $CH_3(CH2)_m—$, where m=1-20. These compounds are described in Italian patent application VE92A00003.

Some examples of the metal-organic mesogens dyes formulas are:

Each mixture consisted of a three-component system corresponding to the following general chemical structure:

(8)

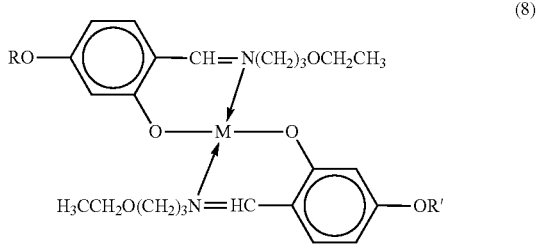

Two iso-functional were linked (both aldehydes) molecules to react simultaneously with the amine and, eventually, with the metal ion. Although only two iso-functional species were utilized (aldehydes and/or amines), a simultaneous synthesis of more than two iso-functional species could provide an increasing number of structurally different metal complexes. Six three-component metallomesogen mixtures were prepared at various combinations of metals and ligands. Each component of the mixture designated with the short formula: L-MII-L, consisted of either MII=$Ni^{2+}$ and $VO^{2+}$ complexed to different combinations of ligands with aliphatic (L), chiral (L*) or acrylic (L') chains shown in the following structures:

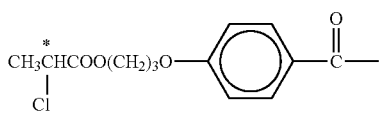

R₁

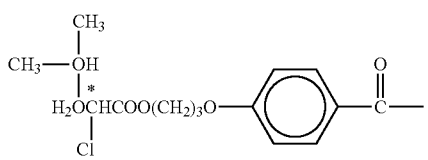

R₂

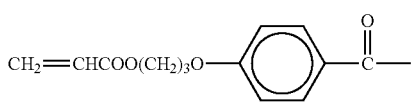

R₃

R₄

Example

| MOM | Component-1 | | Component-2 | | Component-3 | | Metal | Color |
|---|---|---|---|---|---|---|---|---|
| | R | R' | R | R' | R | R' | | |
| Gauzy-1 | R4 | R3 | R4 | R4 | R3 | R3 | $Ni^{2+}$ | Pale Green |
| Gauzy-2 | R4 | R3 | R4 | R4 | R3 | R3 | $VO^{2+}$ | Pink |

Formula of the Metallomesogen Chemical Mixtures:
Gauzy-1 & Gauzy-2:
25% R&R': —$(CH_2)_7$—$CH_3$;
25% R&R': —$C_6H_5$—O—$(CH_2)_6$—OOC—CH=$CH_2$;
50% R: —$(CH_2)_7$—CH3; R': —$C_6H_5$—O—$(CH_2)_6$—OOC—CH=$CH_2$.

In a preferred embodiment of the present invention the metal-organic mesogens have been modified by the addition of chromophore groups, thus providing a dichroic dye composition comprising metallomesogen (MOM) molecules. This composition is added to liquid crystal devices, thereby providing a film with the following properties: switchable UV and IR transmittance and absorption. The chromophore groups absorb certain wavelengths of and transmit or reflect others. The chromophore groups have two molecular orbitals differing from each other by photon energy within the range of the UV-visible-near IR spectrum.

As should be apparent to those working in this art, the difference in physical properties of the MOMs as compared to the non-metal containing liquid crystal traditionally used in polymer dispersed liquid crystal composites, provides a mechanism of control over the kinetics of phase separation and resin curing to vary and particularly to improve the contrast ratio (transparency/opacity) of polymer dispersed liquid crystal films by controlling (i) the solubility of liquid crystal in the resin, (ii) the rate of droplet formation, (iii) controlling the rate of polymer solidification, and (iv) controlling the liquid crystal droplet morphology (size, density). This is especially the case where MOMs are used in conjunction with conventional, non-metallic liquid crystals in the polymer dispersed liquid crystal composite.

In one preferred embodiment of the invention, the organometallic liquid crystal is used in combination with another compatible liquid crystal composition that is non-metallic. Preferably, these other liquid crystals are of the nematic form or operationally nematic which means that, in the absence of external fields, structural distortion of the liquid crystal is dominated by the orientation of the liquid crystal at its boundaries rather than by bulk effects, such as very strong twists (as in cholesteric material) or layering (as in smectic material). Thus, for example, a liquid crystal material including chiral ingredients which induce a tendency to twist but which cannot overcome the effects of the boundary alignment of the liquid crystal material would be considered to be operationally nematic. More preferably, they also have a positive dielectric anisotropy.

In another preferred embodiment of the invention, the organometallic liquid crystal comprises 100% of the discontinuous liquid crystal phase, droplets and/or continuous liquid crystal network. In these embodiments, mixtures of compatible organometallic liquid crystals are employed. Such mixtures may be eutectic mixtures of organometallic liquid crystals. In still other embodiments, mixtures (including eutectic mixtures) of organometallic liquid crystals and their ligands are employed. The inclusion of the ligands of the organometallic liquid crystals in mixtures of the organometallic liquid crystals may improve the solubility of the organometallic liquid crystals.

Where organometallic liquid crystals are uses in combination with organic liquid crystal hosts, the organometallic liquid crystals should be compatible with the organic liquid crystal host. Preferably, the organometallic liquid crystals should be soluble in liquid crystal host. A proper mixture of metal-organic mesogens as well as with their parent ligands generally form a eutectic melting mixture. This is noted by the suppression of crystalline transition temperature and increase of liquid crystal to liquid transition temperature ($T_{ni}$).

In a preferred embodiment of the present invention the metal-organic mesogens have been modified by the addition of chromophore groups, thus providing a dichroic dye composition comprising metallomesogen (MOM) molecules. This composition is added to liquid crystal devices, thereby providing a film with the following properties: switchable UV and IR transmittance and absorption. The chromophore groups absorb certain wavelengths of and transmit or reflect others. The chromophore groups have two molecular orbitals differing from each other by photon energy within the range of the UV-visible-near IR spectrum.

Solar-Absorptive Components Characteristics

The mere presence of the MOM-dyes in the liquid crystal dispersion confers certain level of visible and/or IR absorption to the film. In a scenario, when the film is in its completely "on-state", where the film is at its maximum transparency and the MOM-dyes are configured thereby in their less exposed state, the visible and/or IR absorption is at 10% due to the presence of said MOM-dyes.

In the same scenario, when the film is in its completely "off-state", where the film is at its maximum opacity and the MOM-dyes are configured thereby in their more exposed state, the visible and/or IR absorption is at 90%.

Figure 10:
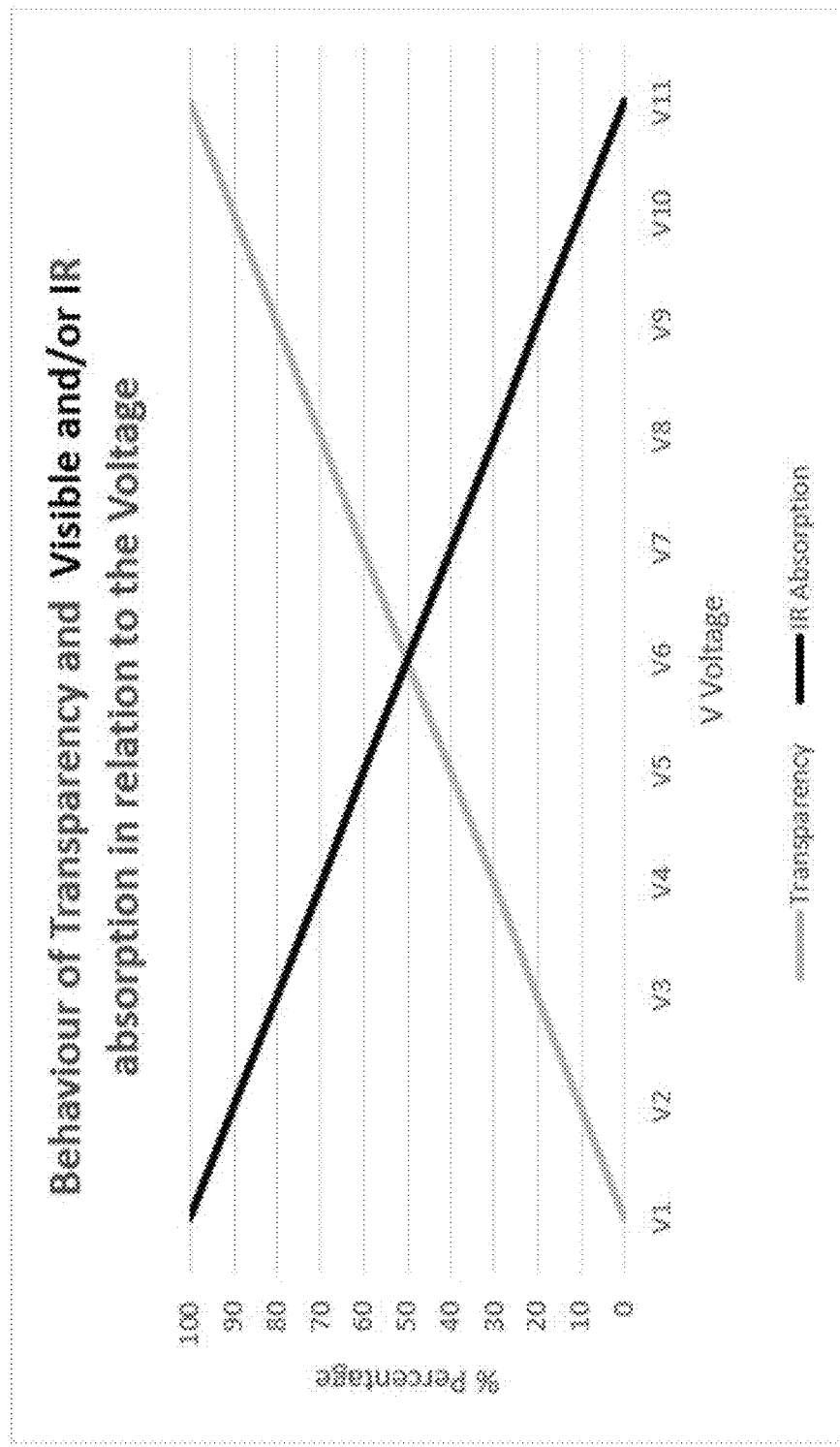
FIG. 10—graph illustrating the behavior of the transparency and visible and/or IR absorption as a function of the voltage applied to the liquid crystal film.

In the scenario where modulation of the liquid crystal characteristics are commanded by a dimmer, the percentage of the visible and IR absorption follow a substantially linear behavior. The more voltage is applied, the more ordinated the molecules become, thereby the film becomes more transparent and the visible and IR absorption decreases, and vice versa. Reference is now made to FIG. 10, which presents a graph illustrating this phenomenon.

Now, with reference to FIG. 1, a schematic representation of one preferred embodiment of the invention 100, a liquid crystal film comprising a liquid crystal phase 10 and two transparent conductor films (like ITO or any other conductive material) 30. Also depicted are examples of MOM-dyes 10a.

Figure 2:
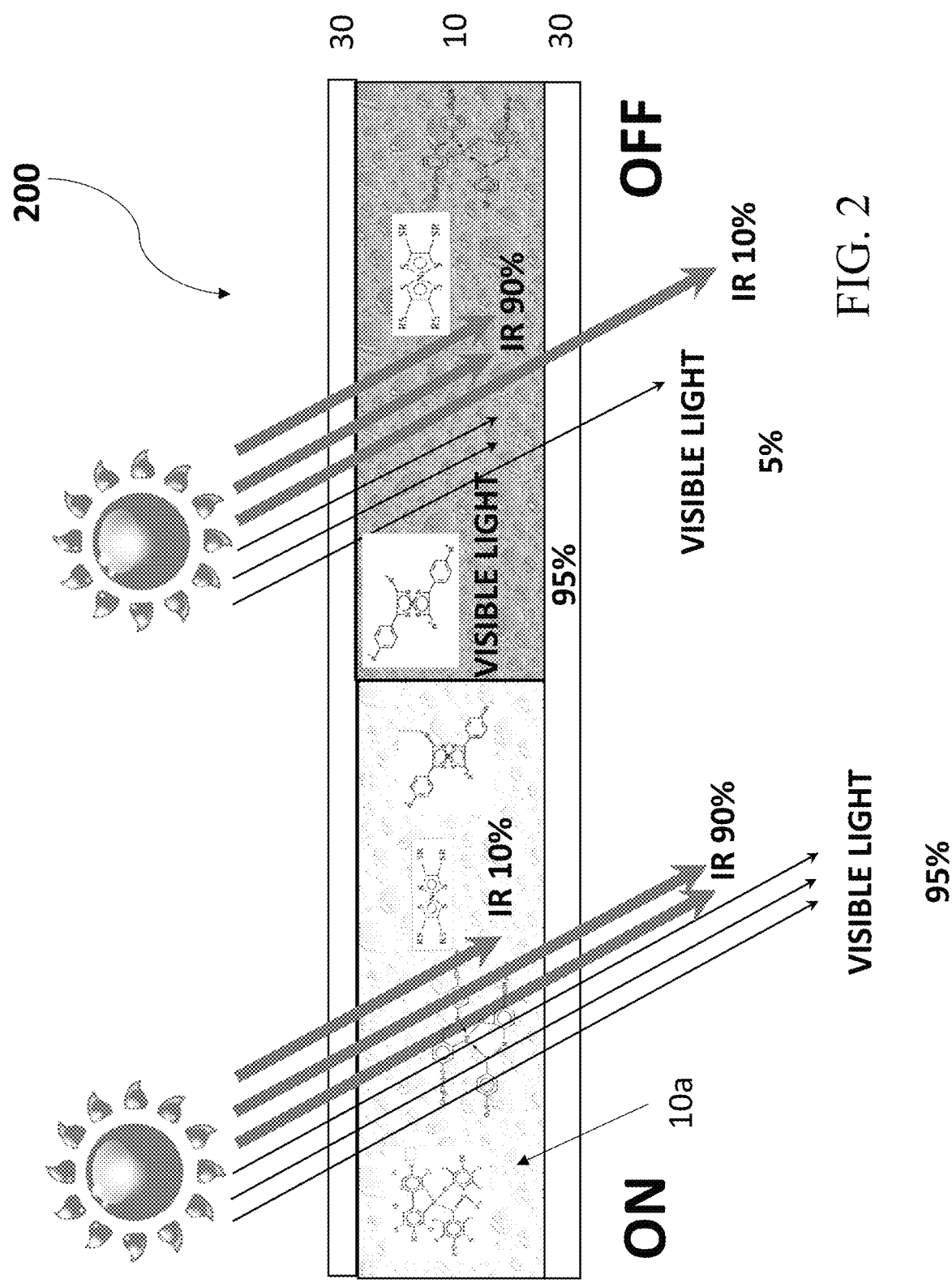
FIG. 2—schematic representation of the properties of one preferred embodiment of the liquid crystal film.

With reference now to FIG. 2, a schematic representation of another preferred embodiment of the liquid crystal device 200. The liquid crystal dispersion 10 is made of electrically switchable nematic liquid crystal dispersions, comprising examples of MOM-dyes 10a, that in an "off-state" is opaque and upon activation of an electric field in "on-state", it becomes clear. In the clear state, visual light is allowed to pass, while in the opaque state visual light is scattered. As mentioned before, the mere presence of the MOM-dyes absorb about 10% of visible and/or IR light. In the "on-state", when the film is at its maximum of transparency, the visible and/or IR absorbance is at its lowest, which means 10%. In "off-state", when the film is at its maximum of opacity, the visible and/or IR absorbance is at its maximum, which allows the entry of about 10% of visible and/or IR radiation (90% is being absorbed). Two transparent conductor film (like ITO or any other conductive material) 30 is also present to allow the proper electro-optical functionality of the liquid crystal device.

In another embodiment of the present invention, the nematic liquid crystal dispersions can be replaced with nematic liquid crystal comprising chiral nematic liquid crystal, which confers the liquid crystal dispersion with cholesteric properties or even replaced with broadband cholesteric liquid crystal.

Figure 3:
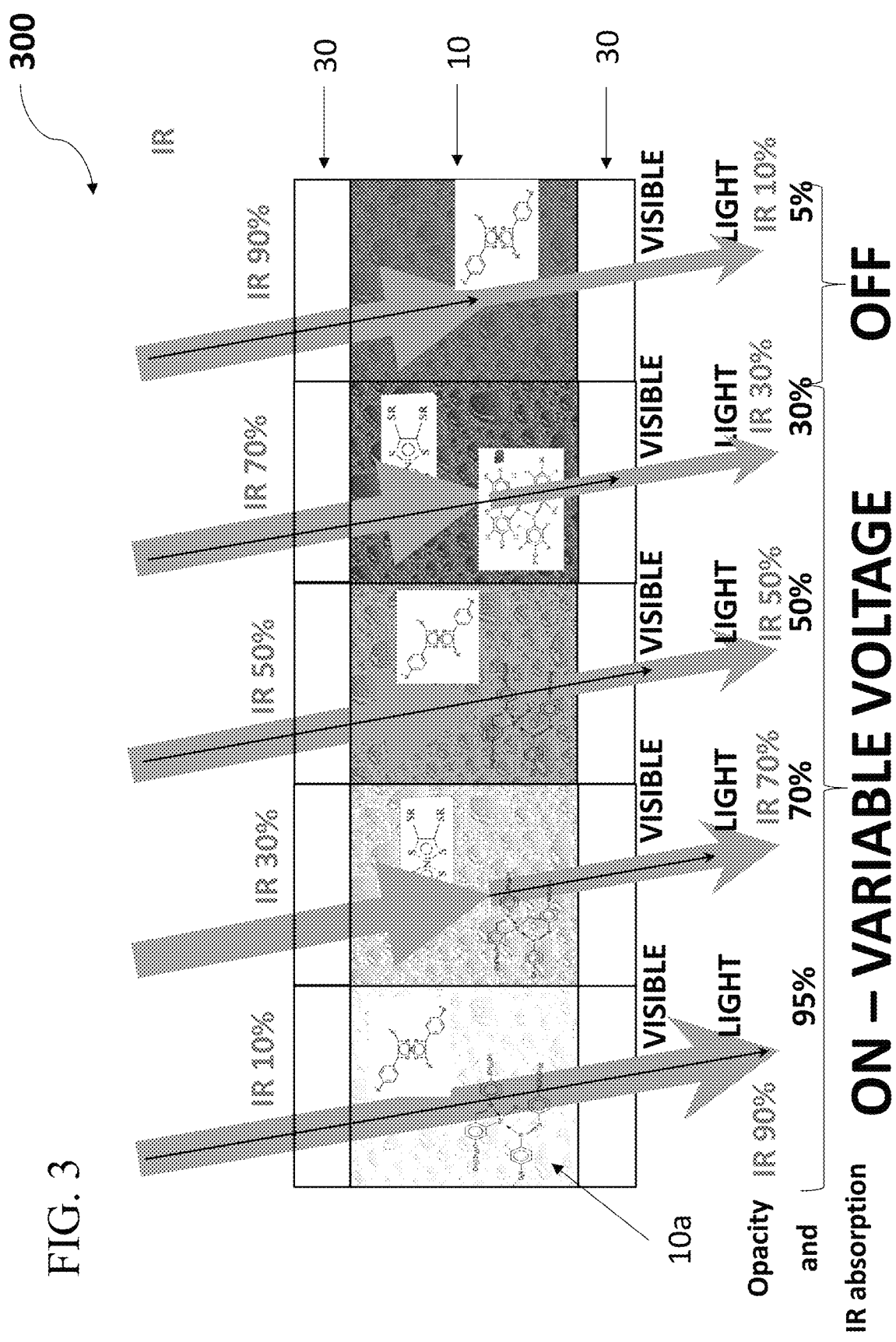
FIG. 3—schematic representation of another possible configuration of the preferred embodiment of the tunable liquid crystal film.

With reference now to FIG. 3, a schematic representation of another preferred embodiment of the tunable liquid crystal device 300 where the IR reflectance correlates with the opacity of the film. The liquid crystal dispersion 10 is made of electrically switchable cholesteric broadband liquid crystal dispersions, including nematic or cholesteric examples of MOM-dyes 10a, that in "off-state" is clear, allowing the passage of visible light and most of solar IR (10% being absorbed by the MOM-dyes). While in the "on-state", the liquid crystal device becomes opaque and visual light and most of the solar IR are blocked (90%). Furthermore, since the film can be tuned, with a variation of the voltage, the cholesteric broadband liquid crystals and/or MOM dye can be tuned to a less opaque and less solar absorption states. As shown in FIG. 3, the closer to the clear state the device is tuned, the more visible light passes through and less solar absorption is achieved. While the more close to the full opaque state, the more visible light is blocked while solar IR mostly absorbed. A transparent conductor film (like ITO or any other conductive material) 30 is also present to allow the proper electro-optical functionality of the liquid crystal device.

In another embodiment of the present invention, the broadband cholesteric liquid crystal dispersions can be replaced with nematic liquid crystal comprising chiral nematic liquid crystal, which confers the liquid crystal dispersion with cholesteric properties.

Figure 4:
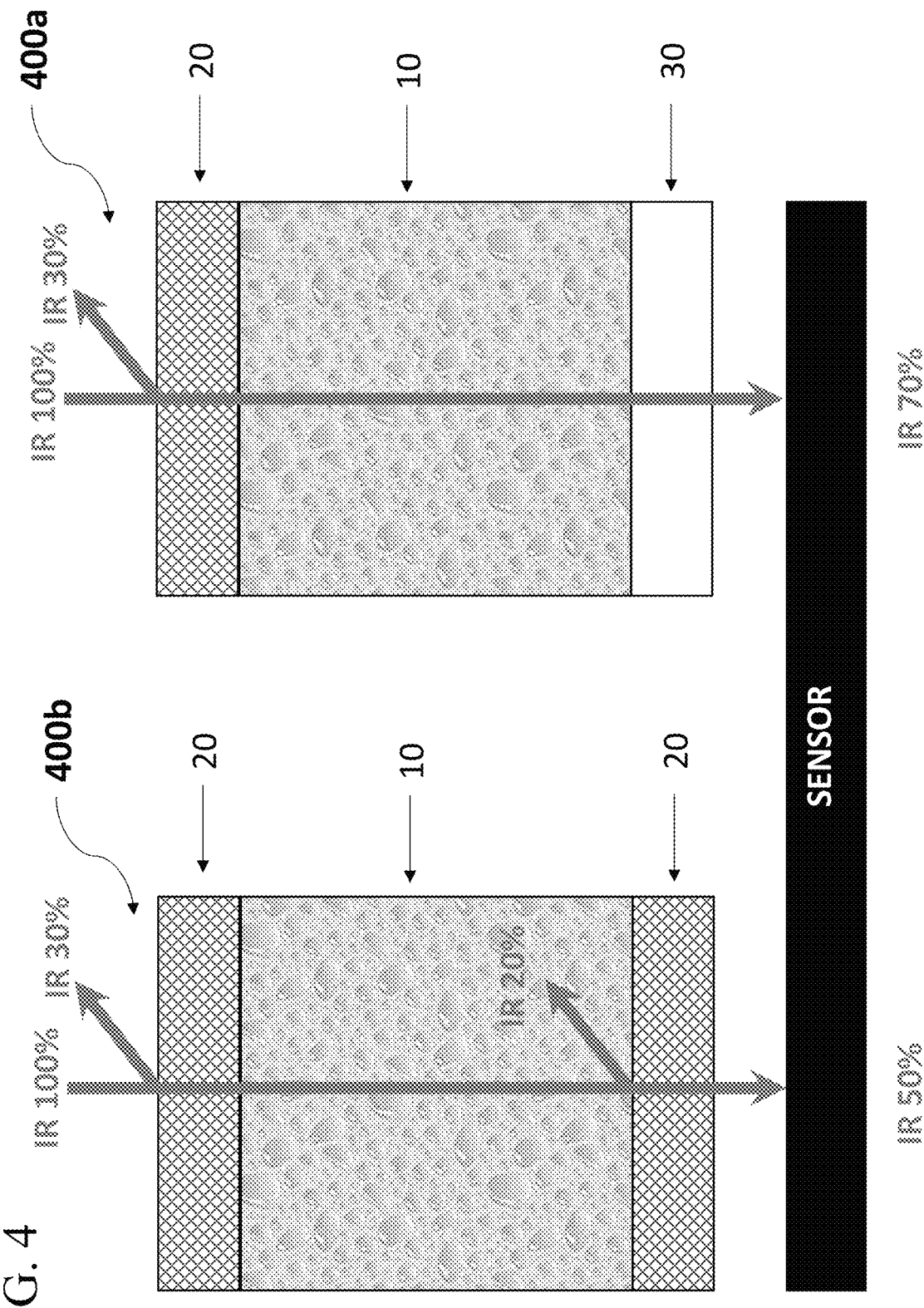
FIG. 4—schematic representation of the experiment made on one or two metalized solar reflective coatings.

In another embodiment of the present invention, the preferred embodiments referenced in FIGS. 2-4, can be an "inverted PDLC", where in the "on-state" the device is opaque, while in the "off-state" the device in clear.

Anchoring of the Liquid Crystal to the Film Substrate

It is well known in the art that anchoring phenomena affect the behavior of the liquid crystal and the necessary voltage required for the maximum control in the transition between the "off-state" and the "on-state", especially when using a dimmer and interval states of liquid crystal orientations are required.

Different types of coatings can be applied to the substrates film in order to increase or decrease the level of anchoring of the liquid crystal to the substrate film in either parallel (strong) or perpendicular (weak) orientations, respectively.

Anchoring of Cholesteric Liquid Crystal

Cholesteric liquid crystals are usually characterized by having a circular rotation represented by "pitch" value and by surface treatment can provide a "high anchoring" level, due to liquid crystal molecules strong surface interaction. In this case, there is much higher control over the tuning of liquid crystal reflection (broadband cholesteric pitch) and absorption (metallomesogen visible and IR dye), due to strong "anchorage" of the variation of cholesteric pitch with electric field. Therefore, variation of voltage will cause variation of the cholesteric pitch, and consequently, tuning of the film within the low-range and high-range reflection and absorption regions.

Solar-Reflective Components

The solar-reflective components reflect IR. The solar-reflective component consist mainly of the following component: at least one IR reflective transparent metallized-coated film as transparent conductor for the LC and polymer composite layer, to reflect the heat at "off-state" and "on-state".

IR Reflective Properties—Example

Figure 5:
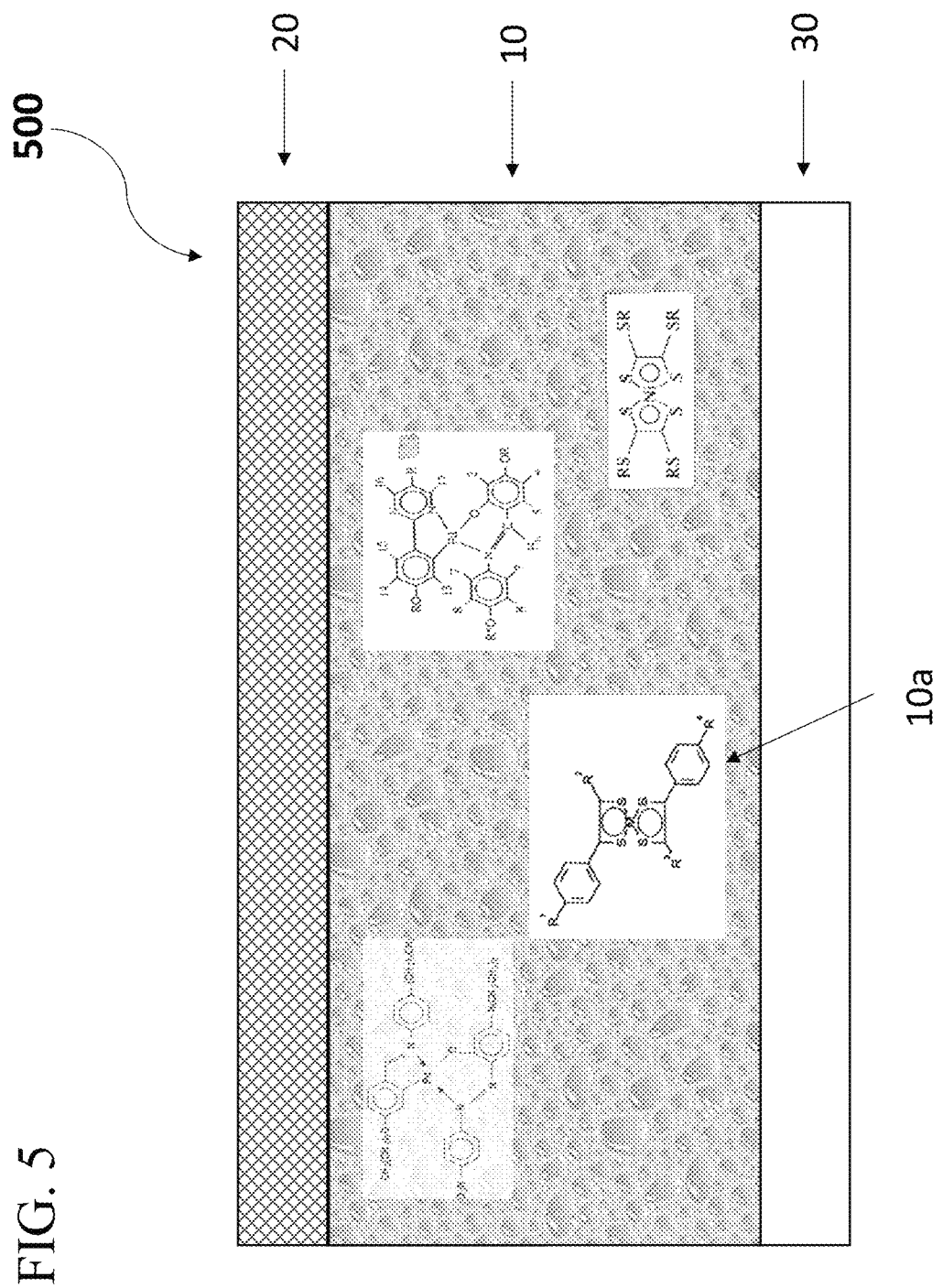
FIG. 5—schematic representation of one embodiment of the solar reflective film comprising one metalized solar reflective coating.
Figure 11:
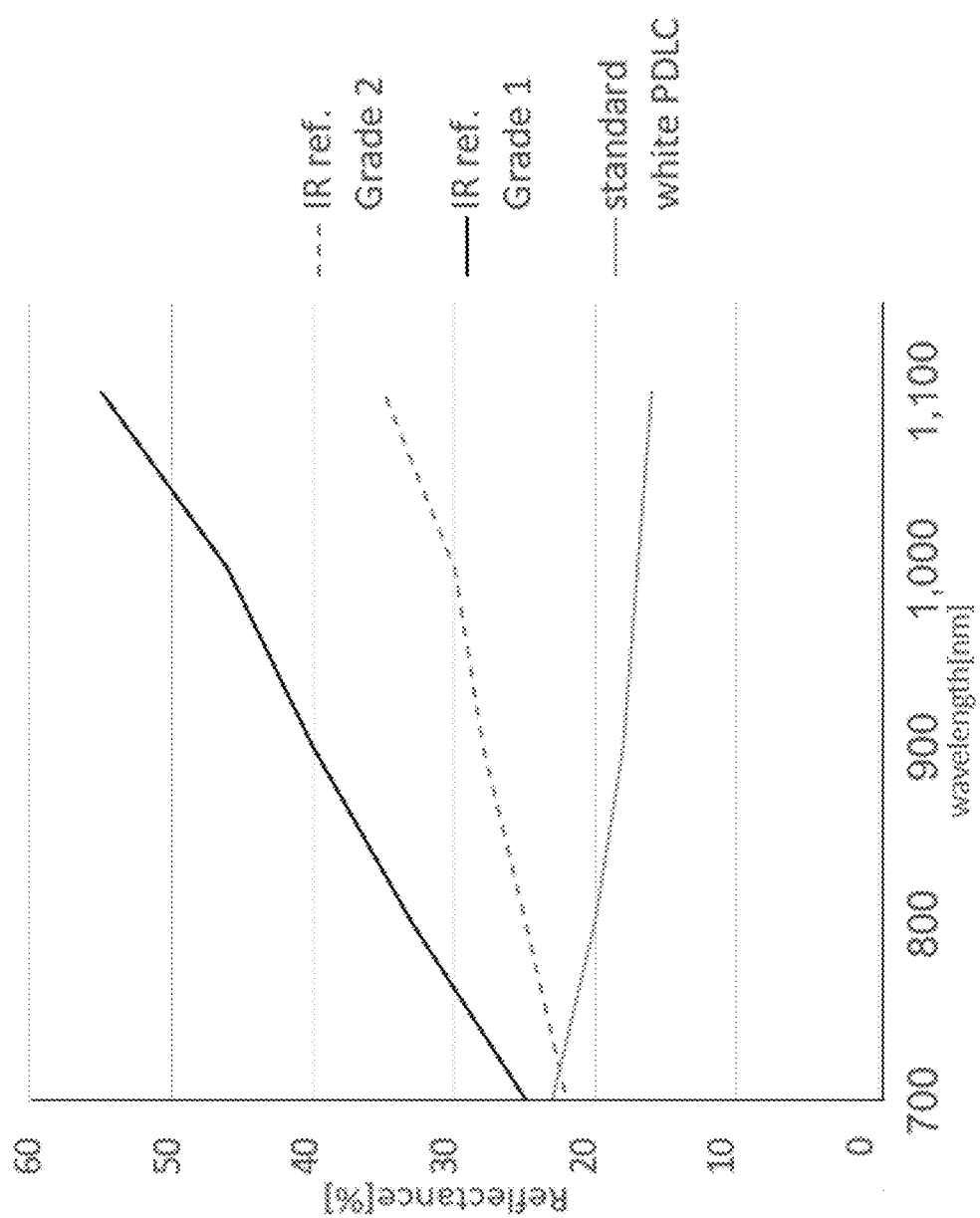
FIG. 11—graph comparing the reflectance spectra of a standard PDLC, a PDLC with one IR-reflective film, and a PDLC with two IR-reflective films.

Referring now to FIG. 5, PDLC films were prepared by substituting the ITO-PET with one and two IR-reflective coated PET support films. The results are the reflective spectra of the PDLC film sample with 700-1100 nm wavelength range, which shows the substantial increase of IR reflections of the PDLC samples with one & two IR-reflective films; FIG. 11 presents a graph illustrating the results. While the maximum reflection value of standard PDLC at 1100 nm is below 20%, those of IR ref 2 (one IR-reflective film) and IR ref.1 (two IR-reflective film) are above 35% and 55%, respectively.

Now, with reference to FIG. 4, a schematic representation of the aforementioned experiment where PDLC 400a, comprises a liquid crystal phase 10, one transparent conductor films (like ITO or any other conductive material) 30 and one IR reflective transparent metallized-coated film as transparent conductor for the LC 20. Another PDLC 400b is depicted, said PDLC comprises a liquid crystal phase 10 and two IR reflective transparent metallized-coated films as transparent conductor for the LC 20. In the experiment both film were subjected to IR radiation. On the other side a sensor was located in order to read the amount of IR radiation (heat) that passes each PDLCs. In PDLC 400a, about 70% of the IR radiation was detected by sensor. Proving that the transparent metallized-coated film reflected about 30% of the IR radiation. In PDLC 400b, about 50% of the IR radiation was detected by sensor. Proving that the transparent metallized-coated film reflected about 50% of the IR radiation.

In one preferred embodiment of the invention, the electrically-switchable solar controlled absorbing-reflective film reflects a constant amount of solar heat at both off-state and on-state, which correlated on the number of transparent metallized-coated films present in the invention. If one is present then about 30% of IR radiation will be passively reflected, while in the presence of two transparent metallized-coated film about 50% of IR radiation will be passively reflected.

Now with reference to FIG. 5, a schematic representation of one preferred embodiment of the invention 500, a liquid crystal film comprising a liquid crystal phase 10, one transparent conductor films (like ITO or any other conductive material) 30 and one IR reflective transparent metallized-coated film as transparent conductor for the LC 20. Also depicted are some examples of MOM-dyes 10a for the visible or IR absorption mode.

Figure 6:
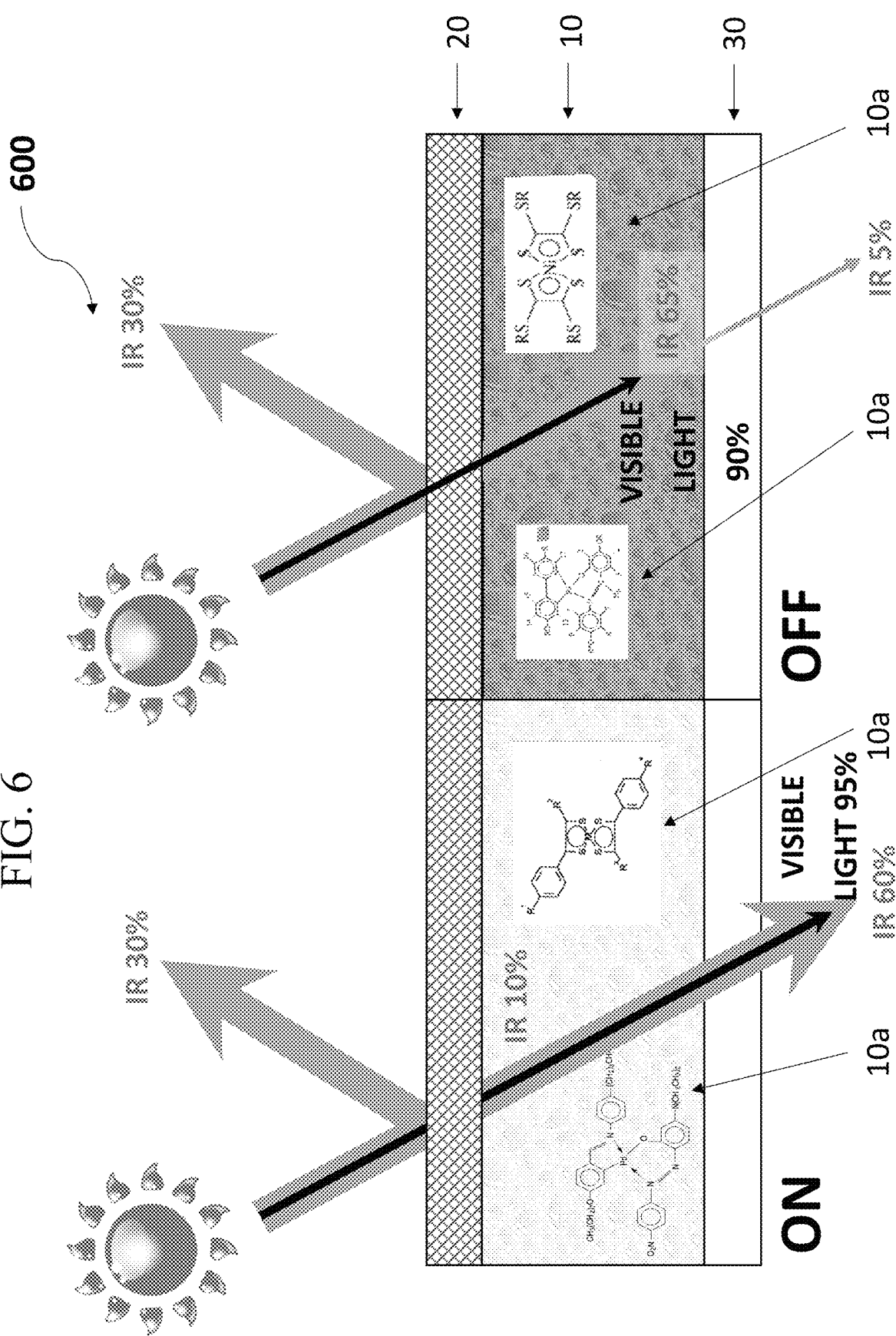
FIG. 6—schematic representation of the properties of one preferred embodiment of the liquid crystal film comprising one metalized solar reflective coating.

Now with reference to FIG. 6, a schematic representation of another preferred embodiment of the liquid crystal device 600. The liquid crystal dispersion 10 is made of electrically switchable nematic liquid crystal dispersions, comprising examples of MOM-dyes 10a, that in an "off-state" is opaque and upon activation of an electric field, "on-state", it becomes clear. In the clear state, visual light is allowed to pass, while in the opaque state visual light is both scattered and also absorbed by MOM dye. One transparent conductor film (like ITO or any other conductive material) 30 is also present to allow the proper functionality of the liquid crystal device, together with one IR reflective transparent metallized-coated film as transparent conductor for the LC 20. The aforementioned reflective transparent metallized-coated film reflects about 30% of the IR. As mentioned before, the mere presence of the MOM-dyes absorb about 10% of the visible or/and IR light. The MOM-dyes and the IR reflective transparent metallized-coated film, sums together to about 40% of IR that is not allowed to pass the film. In the "on-state", when the film is at its maximum of transparency, the IR absorbance is at its lowest, which means 10% from the MOM-dyes and 30% from the IR reflective transparent metallized-coated film. At "off-state", when the film is at its maximum of opacity, the visible and IR absorbance is at its maximum, which allows the entry of about 5% of IR radiation (65% is being absorbed and 30% is being reflected).

In another embodiment of the present invention, the nematic liquid crystal dispersions can be replaced with a mixture of nematic liquid crystal comprising chiral mesogenic and/or non-mesogenic components, which confers the liquid crystal dispersion with cholesteric properties or even replaced with broadband cholesteric liquid crystal.

Now with reference to FIG. 7, a schematic representation of another preferred embodiment of the tunable liquid crystal device 700 with weak surface anchoring where the IR reflectance correlates with the opacity of the film. One transparent conductor film (like ITO or any other conductive material) 30 is also present to allow the proper functionality of the liquid crystal device, together with at least one IR reflective transparent metallized-coated film as transparent conductor for the LC 20. The aforementioned reflective transparent metallized-coated film reflects about 30% of the IR. The liquid crystal dispersion 10 is made of electrically switchable cholesteric broadband liquid crystal domains, including MOM-dyes 10a, which in the "off-state" is clear, allowing the partial passage of visible light and about 60% of solar IR (10% being absorbed by the MOM-dyes and 30-60% is being reflected by one or two transparent metallized-coated films). While in the "on-state", the liquid crystal device becomes opaque and visual light and most of the solar IR are blocked (95%). Furthermore, since the film can be tuned, with a variation of the voltage, the cholesteric broadband liquid crystals can be tuned to a less opaque and less solar absorption states. As shown in FIG. 6, the closer to the clear state the device is tuned, the more visible light passes through and less solar absorption is achieved. While the more close to the full opaque state, the more visible light is blocked while solar IR mostly absorbed.

In another embodiment of the present invention, the broadband cholesteric liquid crystal dispersions can be replaced with nematic liquid crystal comprising chiral nematic liquid crystal, which confers the liquid crystal dispersion with cholesteric properties.

In another embodiment of the present invention, the preferred embodiments referenced in FIGS. 5-7, can be a "reverse mode PDLC", where in the "On" state the device is opaque, while in the "Off" state, the device in clear.

Figure 8:
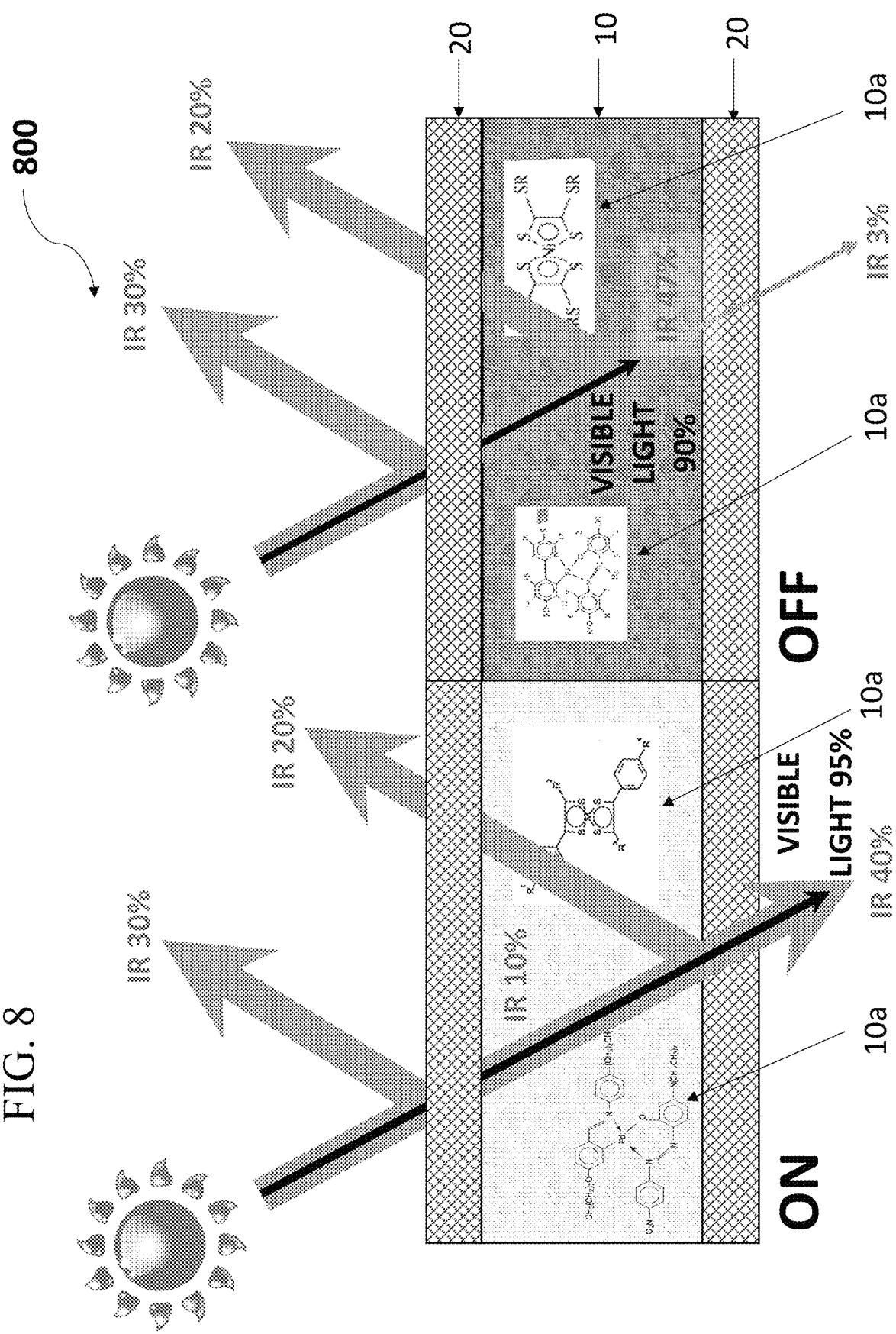
FIG. 8—schematic representation of the properties of one preferred embodiment of the liquid crystal film comprising two metalized solar reflective coating.

Now with reference to FIG. 8, a schematic representation of another preferred embodiment of the liquid crystal device 800. The liquid crystal dispersion 10 is made of electrically switchable nematic liquid crystal dispersions, comprising examples of MOM-dyes 10a, that in an "off-state" is opaque and upon activation of an electric field, "on-state", it becomes clear. In the clear state, visual light is allowed to pass, while in the opaque state visual light is both scattered and also absorbed by MOM dye. Two IR reflective transparent metallized-coated films are present as transparent conductor for the LC 20, to allow the proper functionality of the liquid crystal device. The aforementioned reflective transparent metallized-coated films together reflect about 50% of the IR. As mentioned before, the mere presence of the MOM-dyes absorb about 10% of the visible or/and IR light. The MOM-dyes and the IR reflective transparent metallized-coated film, sums together to about 60% of IR that is not allowed to pass the film. In the "on-state", when the film is at its maximum of transparency, the IR absorbance is at its lowest, which means 10% from the MOM-dyes and 50% from the IR reflective transparent metallized-coated film. At "off-state", when the film is at its maximum of opacity, the visible and IR absorbance is at its maximum, which allows the entry of about 2% of IR radiation (47% is being absorbed and 50% is being reflected).

Accordingly, the embodiment described in FIG. 8 can also be tunable (as shown in FIG. 7), allowing to control the opacity and IR absorption using different voltages.

Figure 9:
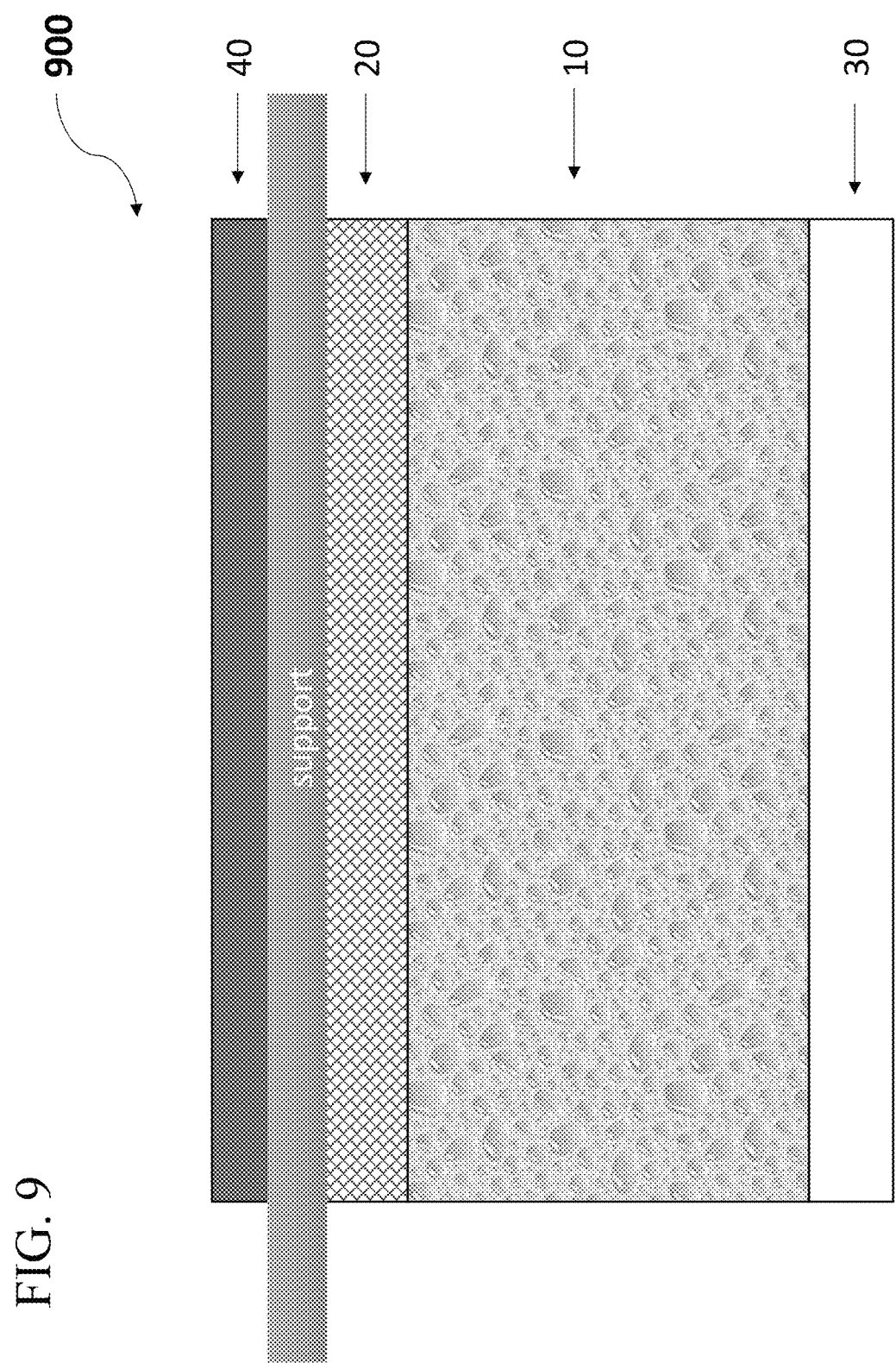
FIG. 9—schematic representation of another possible configuration of the preferred embodiment comprising and external reflective enhance coating.

With reference now to FIG. 9, a schematic representation of one preferred embodiment of the invention 900, a liquid crystal film comprising one IR reflective transparent metallized conducting film coating 20, a liquid crystal phase 10, a transparent conductor film (like ITO silver or any other conductive material) 30, and a reflective enhancer coating 40 on top of the transparent metallized conducting film coating 20. One example of a reflective enhance coating can be a 3M film.

In another preferred embodiment of the invention, the electrically-switchable solar controlled absorbing-reflective film comprises a pattern.

In another preferred embodiment invention, the electrically-switchable solar controlled absorbing-reflective film comprises a low-definition display or signage.

In another preferred embodiment of the invention, the electrically-switchable solar controlled absorbing-reflective film will comprise bi-stable liquid crystal dispersions. Bi-stable systems operate in a different manner, whereby a voltage pulse at different frequencies is applied to switch from a scattering/opaque state to a transparent state, and vice versa. At one voltage/frequency pulse condition, the material is opaque or optically scattering, because the liquid crystal is randomly oriented throughout the system, and thus the refractive indices vary spatially. At another voltage/frequency pulse condition, the material is transparent, because the liquid crystal is uniformly aligned and the material becomes an optically uniform medium. There is no need to maintain the current in order to stay in either scattering/opaque state or transparent state.

In another preferred embodiment of the invention the bi-stable liquid crystal dispersion can be tuned by either continuous field or pulses the same way broadband cholesteric liquid crystal can be tuned, in order to provide different levels of opacity.

According to the present invention, the liquid crystal dispersion is characterized by a morphology in polymer matrix (continuous phase) of liquid crystal nano-droplets, micro-droplets or macro-droplets (discontinuous phase), or by gel network morphology with discontinuous polymer phase in continuous liquid crystal domains. The liquid crystal dispersion could be made by phase separation or micro-encapsulation methods.

According to the present invention, the liquid crystal dispersion is allocated between two flexible transparent conductive supports, such as Indium Tin Oxide (ITO), silver or any other conductive materials. Furthermore, at least one of the conductive supports is characterized by a reflective coating, such as silver, gold, etc. Finally, at least one of the plastic conductive films is made of conductive polymer coating, such as PEDOT-SS.

In a preferred embodiment the electrically-switchable solar controlled absorbing-reflective film can be enclosed between two glasses or may be retrofitted on existing interior and exterior architectural glazing, automotive windows, and other interior glazing. A transparent wet or dry adhesive can be used to stick the panel to the window, which may be integral with the panel or separately provided. The panel may also be applied to original windows before installation.

In another preferred embodiment any of the transparent flexible films can be coated with an anti-scratch hard coating. Furthermore, any of said transparent flexible films can be coated with a dry or wet adhesive to create a retrofit film. Therefore, said PDLC can be a stand-alone device or retrofitted into an already existing surface.

This invention can be used in a wide variety of applications including, but not limited to, static and dimmable energy-control architectural privacy windows; dynamic heat and vision control automotive glazing; switchable heat-reflective marine and aviation glazing; dynamic architectural and automotive display glass; static and dimmable energy-control external architectural windows; static and dimmable vision and heat control automotive glazing; and dimmable colored energy-control architectural and automotive glazing.

What is claimed is:

1. A solar absorbing-reflective film, comprising:
    a flexible infrared (IR) reflective transparent conductive film (20) comprising a single layer of a single material;
    a flexible transparent conductive film (30) comprising a single layer of a single material;
    at least one layer of liquid crystal dispersion located between said flexible IR reflective transparent conductive film and said flexible transparent conductive film (10), said liquid crystal dispersion comprising metal-organic mesogen dye compositions; and,
    at least one electrical contact in communication with said flexible transparent conductive film;
  wherein:
    said liquid crystal dispersion comprises at least one liquid crystal mixture selected from the group consisting of:
      a cholesteric liquid crystal mixture characterized by broad-band wavelength reflecting capabilities;
      a cholesteric liquid crystal mixture characterized by a broad-band wavelength reflecting capability characterized by a pitch in an IR region; and,
      chiral nematic mixtures of liquid crystal in said liquid crystal dispersion adapted to behave as a broadband cholesteric phase; and,
    said at least one liquid crystal mixture is configured to allow IR reflection of said solar absorbing-reflective film to be dynamically controlled by an amount of electric field applied.

2. The solar absorbing-reflective film according to claim 1, wherein said flexible IR reflective transparent conductive film is metallized-coated and composed of a material selected from the group consisting of silver, gold, titanium dioxide, bronze, and stainless steel.

3. The solar absorbing-reflective film according to claim 1, wherein said solar absorbing-reflective film is integrated within a liquid crystal device, and said device is a flexible electrooptical liquid crystal device.

4. The solar absorbing-reflective film according to claim 1, wherein said liquid crystal dispersion is characterized by at least one of the following:
    liquid crystal dispersion morphology in polymer matrix of nano-droplets, micro-droplets, macro-droplets or network gel;
    said liquid crystal dispersion comprises liquid crystals made by phase separation methods;
    said liquid crystal dispersion comprises liquid crystals made by micro-encapsulation methods;
    said liquid crystal dispersion contains dichroic organic and metal-organic compositions; and,
    said liquid crystal dispersion is selected from the group consisting of PDLC, PNLC, and PSCT.

5. The solar absorbing-reflective film according to claim 1, wherein said flexible IR reflective transparent conductive film is made of a material selected from the group consisting of:
    a transparent coating; and,
    a conductive polymer coating.

6. The solar absorbing-reflective film according to claim 1, wherein said solar absorbing-reflective film is characterized by at least one characteristic selected from the following:
    said flexible transparent conductive film is coated with a reflectivity enhancer;
    said flexible IR reflective transparent conductive film is coated by a reflectivity enhancer; and,
    transparency of said solar absorbing-reflective film is dynamically controlled by an amount of electric field.

7. The solar absorbing-reflective film according to claim 1, wherein said liquid crystal dispersion comprises a cholesteric liquid crystal mixture characterized by a broad-band wavelength reflecting capability, said cholesteric mixture further characterized by at least one of the following:
    said cholesteric liquid crystal mixture comprises at least two different layers of cholesteric materials having opposite chirality orientations; and,
    said cholesteric liquid crystal mixture is a mix of opposite chirality orientation cholesteric materials encapsulated by a micro-encapsulation technique.

8. The solar absorbing-reflective film according to claim 1, wherein said solar absorbing-reflective film comprises at least one selected from the group consisting of:
    a pattern; and,
    a low-definition display or signage.

9. The solar absorbing-reflective film according to claim 1, wherein said solar absorbing-reflective film is retrofitted into an already existing surface.

10. The solar absorbing-reflective film according to claim 1, wherein said liquid crystal dispersion is characterized by bistable capabilities.

11. A method for manufacturing a solar absorbing-reflective film, comprising:
    providing at least one flexible infra-red (IR) reflective transparent conductive film (20) comprising a single layer of a single material;
    providing at least one flexible transparent conductive film (30) comprising a single layer of a single material;
    positioning at least one layer of liquid crystal dispersion (10) comprising metal-organic mesogen dyes compositions between said at least one flexible IR reflective transparent conductive film and said at least one flexible transparent conductive film; and, connecting an electrical contact to at least one of said at least one flexible transparent conductive film;
wherein:
said liquid crystal dispersion comprises at least one liquid crystal mixture selected from the group consisting of:
a cholesteric liquid crystal mixture characterized by broad-band wavelength reflecting capabilities;
a cholesteric liquid crystal mixture characterized by a broad-band wavelength reflecting capability characterized by a pitch in an IR region; and,
chiral nematic mixtures of liquid crystal in said liquid crystal dispersion adapted to behave as a broadband cholesteric phase; and,
said step of positioning at least one layer of liquid crystal dispersion comprises positioning said at least one layer of liquid crystal dispersion such that IR reflection of said film is dynamically controlled by an amount of electric field.

12. The method according to claim 11, wherein said at least one flexible IR reflective transparent conductive film is metallized-coated and composed of a material selected from the group consisting of silver, gold, titanium dioxide, bronze, and stainless steel.

13. The method according to claim 11, wherein said solar absorbing-reflective film is integrated within a liquid crystal device, and said device is a flexible electro-optical liquid crystal device.

14. The method according to claim 11, wherein said liquid crystal dispersion is characterized by at least one of the following:
a liquid crystal dispersion morphology in polymer matrix selected from the group consisting of nano-droplets, micro-droplets, macro-droplets, and network gel;
said liquid crystal dispersion is made by phase separation methods;
said liquid crystal dispersion is made by micro-encapsulation methods;
said liquid crystal dispersion contains a composition selected from the group consisting of dichroic organic compositions and metal-organic compositions; and,
said liquid crystal dispersion is selected from the group consisting of PDLC, PNLC, and PSCT.

15. The method according to claim 11, wherein said at least one flexible IR reflective transparent conductive film is made of a material selected from the group consisting of:
a transparent coating; and,
a conductive polymer coating.

16. The method according to claim 11, wherein said solar absorbing-reflective film is characterized by at least one of the following:
said at least one flexible IR reflective transparent conductive film is coated with an enhanced reflective film;
said at least one flexible transparent conductive film is coated with an enhanced reflective film; and,
transparency of said solar absorbing-reflective film is dynamically controlled by an amount of electric field applied.

17. The method according to claim 11, wherein said liquid crystal dispersion comprises a cholesteric mixture and is characterized by at least one of the following:
said liquid crystal dispersion comprises at least two different layers of cholesteric materials having opposite chirality orientations; and,
said liquid crystal dispersion is a mix of opposite chirality orientation cholesteric materials encapsulated by a micro-encapsulation technique.

18. The method of claim 11, further comprising retrofitting said solar absorbing-reflective film into an already existing surface.

19. The method according to claim 11, wherein said solar absorbing-reflective film comprises at least one selected from the group consisting of:
a pattern; and,
a low-definition display or signage.

20. The method according to claim 11, wherein said solar absorbing-reflective film is bistable.

* * * * *